US012796267B2

(12) United States Patent
Choi et al.

(10) Patent No.: US 12,796,267 B2
(45) Date of Patent: Nov. 10, 2026

(54) DISPLAY DEVICE

(71) Applicant: Samsung Display Co., Ltd., Yongin-si (KR)

(72) Inventors: Sungjin Choi, Hwaseong-si (KR); Joohyung Lee, Yongin-si (KR); Jin Jeon, Seoul (KR); Jungnam Park, Cheonan-si (KR); Seungdeok Yoon, Asan-si (KR); Chang-Yeol Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 697 days.

(21) Appl. No.: 17/982,363

(22) Filed: Nov. 7, 2022

(65) Prior Publication Data

US 2023/0157115 A1 May 18, 2023

(30) Foreign Application Priority Data

Nov. 12, 2021 (KR) ........................ 10-2021-0156022

(51) Int. Cl.
*H10K 59/35* (2023.01)
*H10K 59/12* (2023.01)

(52) U.S. Cl.
CPC ........... *H10K 59/352* (2023.02); *H10K 59/12* (2023.02)

(58) Field of Classification Search
CPC ............................................ H10K 59/352–353
See application file for complete search history.

(56) References Cited

U.S. PATENT DOCUMENTS

| | | | | |
|---|---|---|---|---|
| 8,654,284 B2 | 2/2014 | Huh et al. | | |
| 8,743,318 B2 | 6/2014 | Baek et al. | | |
| 9,440,874 B2 | 9/2016 | Otosaka | | |
| 10,050,234 B2 | 8/2018 | Kim et al. | | |
| 10,692,938 B2 | 6/2020 | Kim | | |
| 11,158,263 B2 | 10/2021 | Choi et al. | | |
| 2016/0103516 A1* | 4/2016 | An | G06F 3/0412 | 345/174 |
| 2017/0097703 A1* | 4/2017 | Lee | G06F 3/0443 | |

(Continued)

FOREIGN PATENT DOCUMENTS

| | | | |
|---|---|---|---|
| KR | 10-2012-0133927 A | 12/2012 | |
| KR | 10-1441756 B1 | 9/2014 | |

(Continued)

*Primary Examiner* — Eric K Ashbahian
(74) *Attorney, Agent, or Firm* — Womble Bond Dickinson (US) LLP

(57) ABSTRACT

A display device includes a display panel and an input sensor. A first-first color light emitting area is spaced apart from a first-second color light emitting area in a first direction, and a second-second color light emitting area is spaced apart from a first-third color light emitting area in the first direction. A first line area is between the first-first and the first-second color light emitting areas, and a second line area between the second-second and the first-third color light emitting areas. A distance between the first line area and the first-second color light emitting area is greater than a distance between the first line area and the first-first color light emitting area, and a distance between the second line area and the second-second color light emitting area is greater than a distance between the second line area and the first-third color light emitting area.

17 Claims, 20 Drawing Sheets

(56) References Cited

U.S. PATENT DOCUMENTS

| | | | | |
|---|---|---|---|---|
| 2020/0089351 | A1* | 3/2020 | Jeong | G06F 3/044 |
| 2021/0223912 | A1* | 7/2021 | Tada | H10K 59/40 |
| 2023/0157094 | A1* | 5/2023 | Li | G06F 3/0421 345/174 |

FOREIGN PATENT DOCUMENTS

| | | | |
|---|---|---|---|
| KR | 10-1583263 | B1 | 1/2016 |
| KR | 10-2018-0075958 | A | 7/2018 |
| KR | 10-2018-0089928 | A | 8/2018 |
| KR | 10-2045035 | B1 | 11/2019 |
| KR | 10-2120808 | B1 | 6/2020 |

* cited by examiner

DISPLAY DEVICE

CROSS-REFERENCE TO RELATED APPLICATION

The present application claims priority to and the benefit of Korean Patent Application No. 10-2021-0156022, filed on Nov. 12, 2021, the entire contents of which is hereby incorporated by reference.

BACKGROUND

1. Field

Aspects of some embodiments of the present disclosure relate to a display device.

2. Description of the Related Art

Electronic devices, such as smartphones, tablet computers, notebook computers, car navigation units, and smart televisions, are ubiquitous in the modern society. Electronic devices may include a display panel to graphically display information to users. Electronic devices may further include various electronic modules in addition to the display panel.

The electronic devices may satisfy various display quality requirements for each purpose of use. Light generated from a light emitting device is emitted to the outside of the electronic devices while generating various optical phenomena such as resonance and interference. These optical phenomena affect the quality of displayed images.

The above information disclosed in this Background section is only for enhancement of understanding of the background and therefore the information discussed in this Background section does not necessarily constitute prior art.

SUMMARY

Aspects of some embodiments of the present disclosure relate to a display device. For example, aspects of some embodiments of the present disclosure relate to a display device including an input sensor.

Aspects of some embodiments of the present disclosure include a display device with relatively improved display quality.

Aspects of some embodiments of the present disclosure include a display device including a display panel including first color light emitting areas, second color light emitting areas, and third color light emitting areas and a non-light-emitting area between the first color light emitting areas, the second color light emitting areas, and the third color light emitting areas and an input sensor including a sensing electrode including a conductive line overlapping the non-light-emitting area and on the display panel. A first-first color light emitting area among the first color light emitting areas is spaced apart from a first-second color light emitting area among the second color light emitting areas in a first direction, a second-second color light emitting area among the second color light emitting areas is spaced apart from a first-third color light emitting area among the third color light emitting areas in the first direction, the conductive line includes a first line area between the first-first color light emitting area and the first-second color light emitting area and a second line area between the second-second color light emitting area and the first-third color light emitting area, a distance between the first line area and the first-second color light emitting area is greater than a distance between the first line area and the first-first color light emitting area, and a distance between the second line area and the second-second color light emitting area is greater than a distance between the second line area and the first-third color light emitting area.

According to some embodiments, each of the first line area and the second line area extends in a second direction crossing the first direction, and the first line area and the second line area have a same line width.

According to some embodiments, a third-second color light emitting area among the second color light emitting areas is spaced apart from the first-second color light emitting area in the first direction, the first-first color light emitting area is between the first-second color light emitting area and the third-second color light emitting area in the first direction, the conductive line further includes a third line area between the first-first color light emitting area and the third-second color light emitting area, and a distance between the third line area and the first-first color light emitting area is smaller than the distance between the first line area and the first-second color light emitting area.

According to some embodiments, each of the first line area and the third line area extends in a second direction crossing the first direction, and the first line area has a line width greater than a line width of the third line area.

According to some embodiments, a third-second color light emitting area among the second color light emitting areas is spaced apart from the first-first color light emitting area in a second direction crossing the first direction, the conductive line further includes a third line area between the third-second color light emitting area and the first-first color light emitting area, and a distance between the third line area and the third-second color light emitting area is greater than a distance between the third line area and the first-first color light emitting area.

According to some embodiments, the distance between the first line area and the first-second color light emitting area is equal to or greater than the distance between the third line area and the third-second color light emitting area.

According to some embodiments, the third line area extends in the first direction.

According to some embodiments, a third-second color light emitting area among the second color light emitting areas is spaced apart from the second-second color light emitting area in the first direction, the first-third color light emitting area is between the second-second color light emitting area and the third-second color light emitting area, the conductive line further includes a third line area between the first-third color light emitting area and the third-second color light emitting area, and a distance between the third line area and the first-third color light emitting area is smaller than a distance between the third line area and the third-second color light emitting area.

According to some embodiments, each of the second line area and the third line area extends in a second direction crossing the first direction, and a line width of the second line area is substantially the same as a line width of the third line area.

According to some embodiments, the distance between the second line area and the first-third color light emitting area is substantially the same as the distance between the third line area and the first-third color light emitting area.

According to some embodiments, a third-second color light emitting area among the second color light emitting areas is spaced apart from the first-third color light emitting area in a second direction crossing the first direction, the conductive line further includes a third line area between the third-second color light emitting area and the first-third color light emitting area, and a distance between the third line area and the third-second color light emitting area is greater than a distance between the third line area and the first-third color light emitting area.

According to some embodiments, the distance between the second line area and the second-second color light emitting area is equal to or greater than the distance between the third line area and third-second color light emitting area.

According to some embodiments, each of the first-first color light emitting area, the first-second color light emitting area, the second-second color light emitting area, and the first-third color light emitting area, includes a first edge, a second edge facing the first edge in the first direction, a third edge, and a fourth edge facing the third edge in a second direction crossing the first direction.

According to some embodiments, the first-second color light emitting area extends in the first direction, and the second-second color light emitting area extends in the second direction.

According to some embodiments, the display device further includes a spherical coordinate system defined therein, a white image displayed in the display panel is measured as a white image shifted to a source light of the second color light emitting areas from a first point (r1, Θ1, ϕ1) of the spherical coordinate system, the first point (r1, Θ1, ϕ1) is on an extension line of the first-first color light emitting area and the first-second color light emitting area in the first direction, and the first-first color light emitting area is closer to the first point (r1, Θ1, ϕ1) than the first-second color light emitting area.

According to some embodiments, the display device further includes an optical film on the input sensor, and the optical film includes a polarizing film and a retarder film.

According to some embodiments, the display device further includes an optical film on the input sensor, and a white image passed through the optical film is shifted to a source light of the first color light emitting areas from the first point (r1, Θ1, ϕ1) when compared with a white image incident into the optical film.

According to some embodiments, each of the first line area and the second line area extends in a second direction crossing the first direction, the first color light emitting areas and the third color light emitting areas define a first light emitting row, the second light emitting areas define a second light emitting row, and the first color light emitting areas are alternately arranged with the third color light emitting areas in the first light emitting row along a third direction crossing the first direction and the second direction.

Aspects of some embodiments of the present disclosure include a display device including a display panel including first color light emitting areas, second color light emitting areas, and third color light emitting areas and a non-light-emitting area between the first color light emitting areas, the second color light emitting areas, and the third color light emitting areas and an input sensor including a sensing electrode including a conductive line overlapping the non-light-emitting area and on the display panel. A first-first color light emitting area among the first color light emitting areas is spaced apart from a first-second color light emitting area among the second color light emitting areas in a first direction, a second-second color light emitting area among the second color light emitting areas is spaced apart from a first-third color light emitting area among the third color light emitting areas in the first direction, the conductive line includes a first line area between the first-first color light emitting area and the first-second color light emitting area and a second line area between the second-second color light emitting area and the first-third color light emitting area, and the first line area has a line width greater than a line width of the second line area.

According to some embodiments, the conductive line further includes a third line area extending from the first line area in a second direction crossing the first direction and adjacent to the first-first color light emitting area, and the line width of the first line area is greater than a line width of the third line area.

According to some embodiments, a phenomenon in which the white image is viewed differently depending on an azimuth angle, i.e., a white angular dependency (WAD), may be reduced. Accordingly, a display quality of the display device may be relatively improved.

BRIEF DESCRIPTION OF THE DRAWINGS

The above and other characteristics of embodiments according to the present disclosure will become readily apparent by reference to the following detailed description when considered in conjunction with the accompanying drawings wherein.

DETAILED DESCRIPTION

Figure 1:
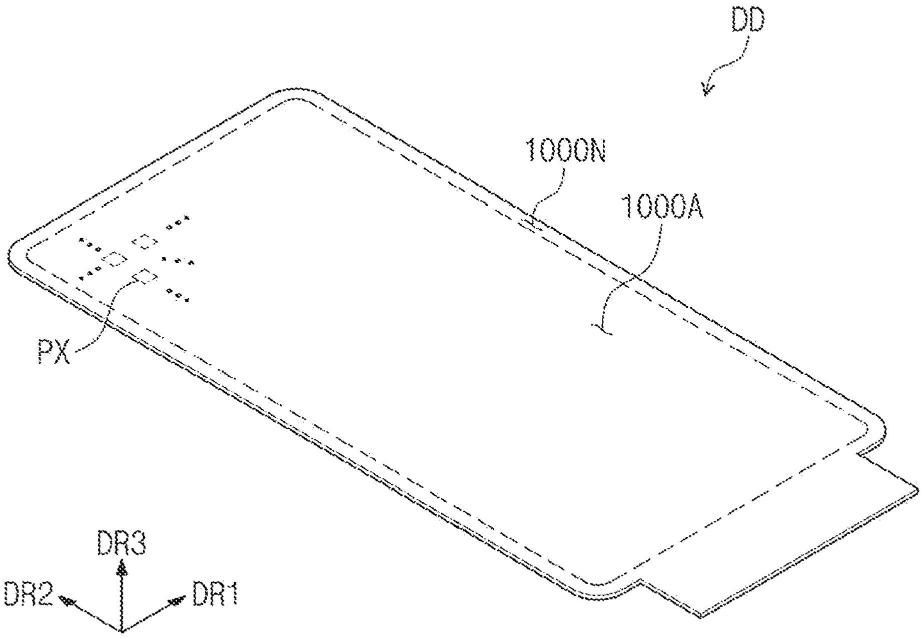
FIG. 1 is a perspective view of a display device according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described in more detail with reference to accompanying drawings.

FIG. 1 is a perspective view showing a display device DD according to some embodiments of the present disclosure.

The display device DD may generate or display images and may sense an external input. The display device DD may include a display area 1000A and a peripheral area 1000N. Pixels PX may be located in the display area 1000A. The pixels PX may include a first color pixel, a second color pixel, and a third color pixel, which generate lights having different colors from each other.

The image may be displayed through the display area 1000A. The display area 1000A may include a plane defined by a first direction DR1 and a second direction DR2. The display area 1000A may further include curved surfaces bent from at least two sides of the plane. However, the shape of the display area 1000A should not be limited thereto or thereby. For example, the display area 1000A may include only the plane, or the display area 1000A may further include two or more curved surfaces, e.g., four curved surfaces respectively bent from four sides of the plane.

Figure 2:
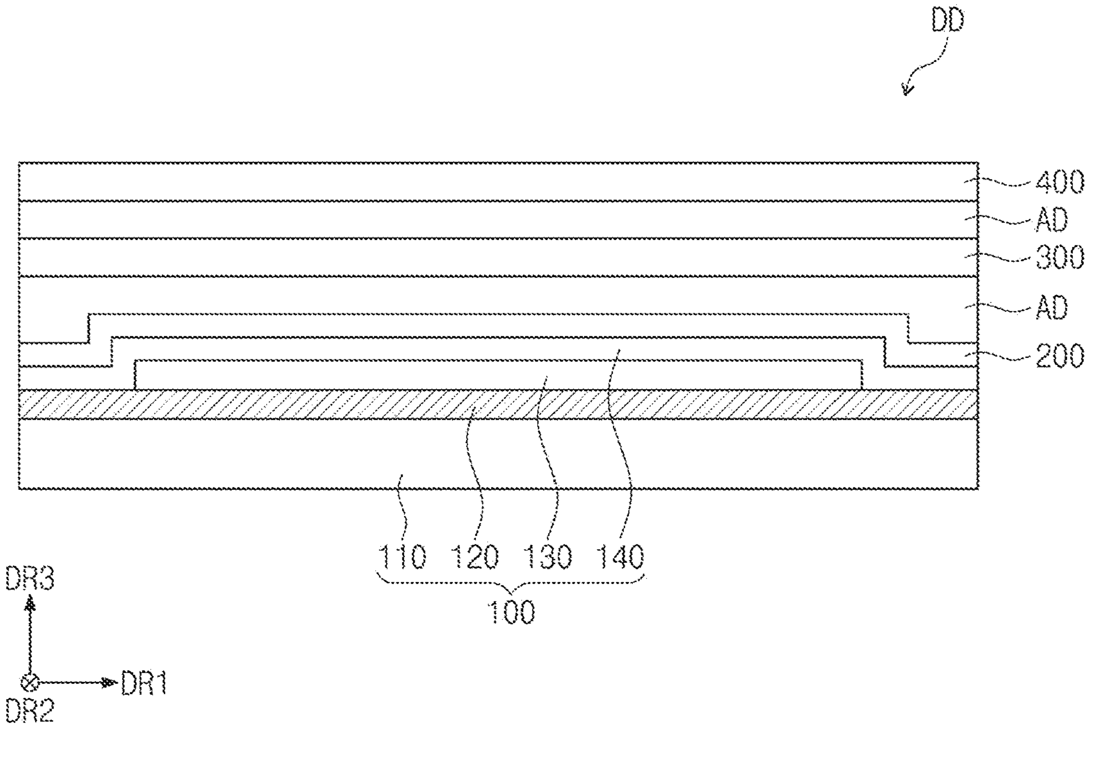
FIG. 2 is a cross-sectional view of a display device according to some embodiments of the present disclosure.

FIG. 2 is a cross-sectional view of the display device DD according to some embodiments of the present disclosure. Referring to FIG. 2, the display device DD may include a display panel 100, an input sensor 200, an anti-reflector 300, and a window 400.

The display panel 100 may be a light emitting type display panel. For example, the display panel 100 may be an organic light emitting display panel, an inorganic light emitting display panel, a micro-LED display panel, or a nano-LED display panel. The display panel 100 may include a base layer 110, a circuit layer 120, a light emitting element layer 130, and an encapsulation layer 140.

The base layer 110 may provide a base surface on which the circuit layer 120 is located. The base layer 110 may be a rigid substrate or a flexible substrate that is bendable, foldable, or rollable. The base layer 110 may be a glass substrate, a metal substrate, or a polymer substrate, however, it should not be limited thereto or thereby. According to some embodiments, the base layer 110 may be an inorganic layer, an organic layer, or a composite material layer.

The base layer 110 may have a multi-layer structure. For instance, the base layer 110 may include a first synthetic resin layer, an inorganic layer having a single-layer or multi-layer structure, and a second synthetic resin layer located on the inorganic layer having a single-layer or multi-layer structure. Each of the first and second synthetic resin layers may include a polyimide-based resin, however, embodiments according to the present disclosure are not particularly limited.

The circuit layer 120 may be located on the base layer 110. The circuit layer 120 may include an insulating layer, a semiconductor pattern, a conductive pattern, and a signal line. The circuit layer 120 may include a driving circuit for the pixels PX described with reference to FIG. 1.

The light emitting element layer 130 may be located on the circuit layer 120. The light emitting element layer 130 may include a light emitting element for the pixels PX described with reference to FIG. 1. For example, the light emitting element may include an organic light emitting material, an inorganic light emitting material, an organic-inorganic light emitting material, a quantum dot, a quantum rod, a micro-LED, or a nano-LED.

The encapsulation layer 140 may be located on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may include a stack structure in which an inorganic layer, an organic layer, and an inorganic layer are sequentially stacked.

The input sensor 200 may be located on the display panel 100. The input sensor 200 may sense an external input applied thereto from the outside. For example, the external input may include a variety of external inputs, such as a part of user's body, light, heat, pen, or pressure.

The input sensor 200 may be formed on the display panel 100 through successive processes. In this case, the input sensor 200 may be located directly on the display panel 100. In the present disclosure, the expression "component A is located directly on component B" means that no intervening elements are present between the component A and the component B. That is, an adhesive member may not be located between the input sensor 200 and the display panel 100.

The anti-reflector 300 may be located on the input sensor 200. The anti-reflector 300 may be coupled to the input sensor 200 by an adhesive layer AD. The anti-reflector 300 may reduce a reflectance with respect to the external light.

The anti-reflector 300 may include an optical film. The optical film may include a polarizing film. The optical film may further include a retarder film. The retarder film may include at least one of a λ/2 retarder film or a λ/4 retarder film.

The window 400 may be located on the anti-reflector 300. The window 400 and the anti-reflector 300 may be coupled to each other by an adhesive layer AD. The adhesive layer may be a pressure sensitive adhesive (PSA) film or an optically clear adhesive (OCA).

The window 400 may include at least one base layer. The base layer may be a glass substrate or a synthetic resin film. The window 400 may have a multi-layer structure. The window 400 may include a thin film glass substrate and a synthetic resin film located on the thin film glass substrate. The thin film glass substrate and the synthetic resin film may be coupled to each other by an adhesive layer, and the adhesive layer and the synthetic resin film may be separated from the thin film glass substrate to be replaced.

According to some embodiments, the adhesive layer AD may be omitted, and the window 400 may be located directly on the anti-reflector 300. An organic material, an inorganic material, or a ceramic material may be coated on the anti-reflector 300.

Figure 3A:
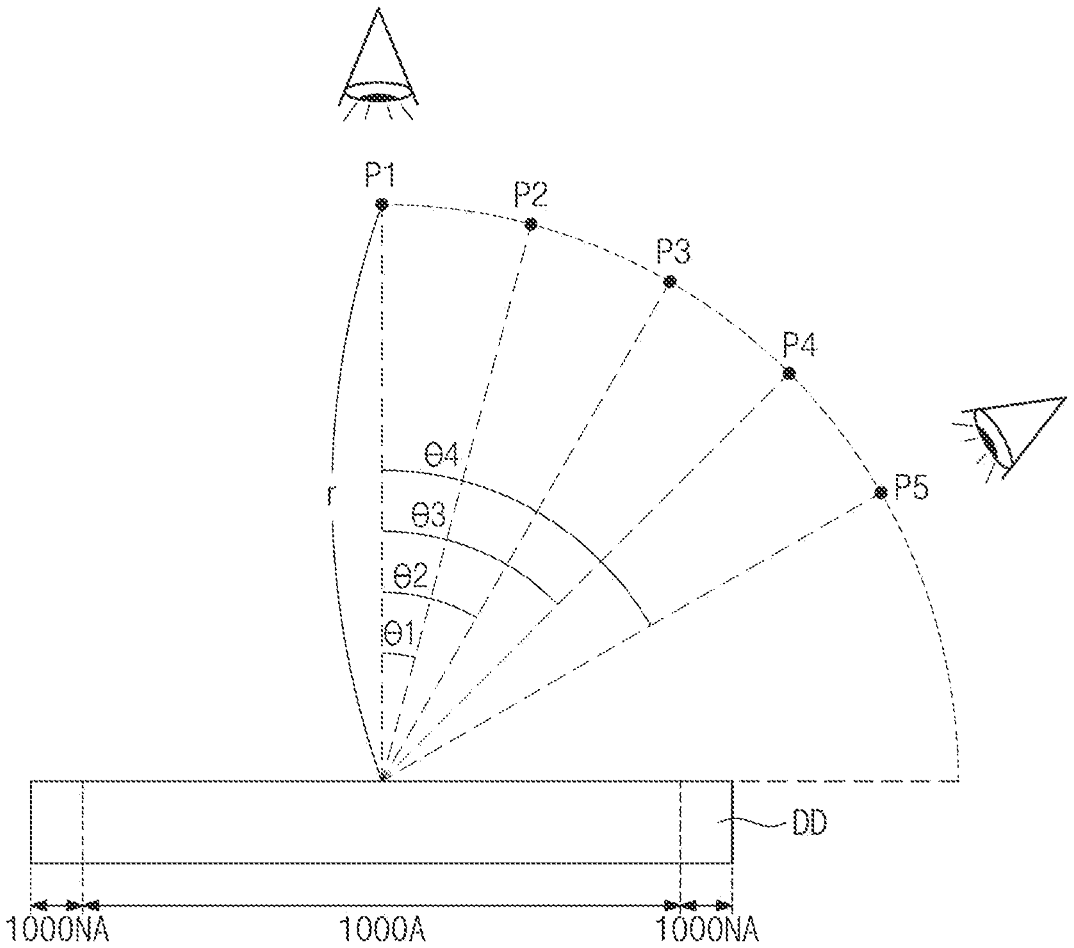
FIGS. 3A and 3B are views of a spherical coordinate system defined in a display device according to some embodiments.
Figure 3B:
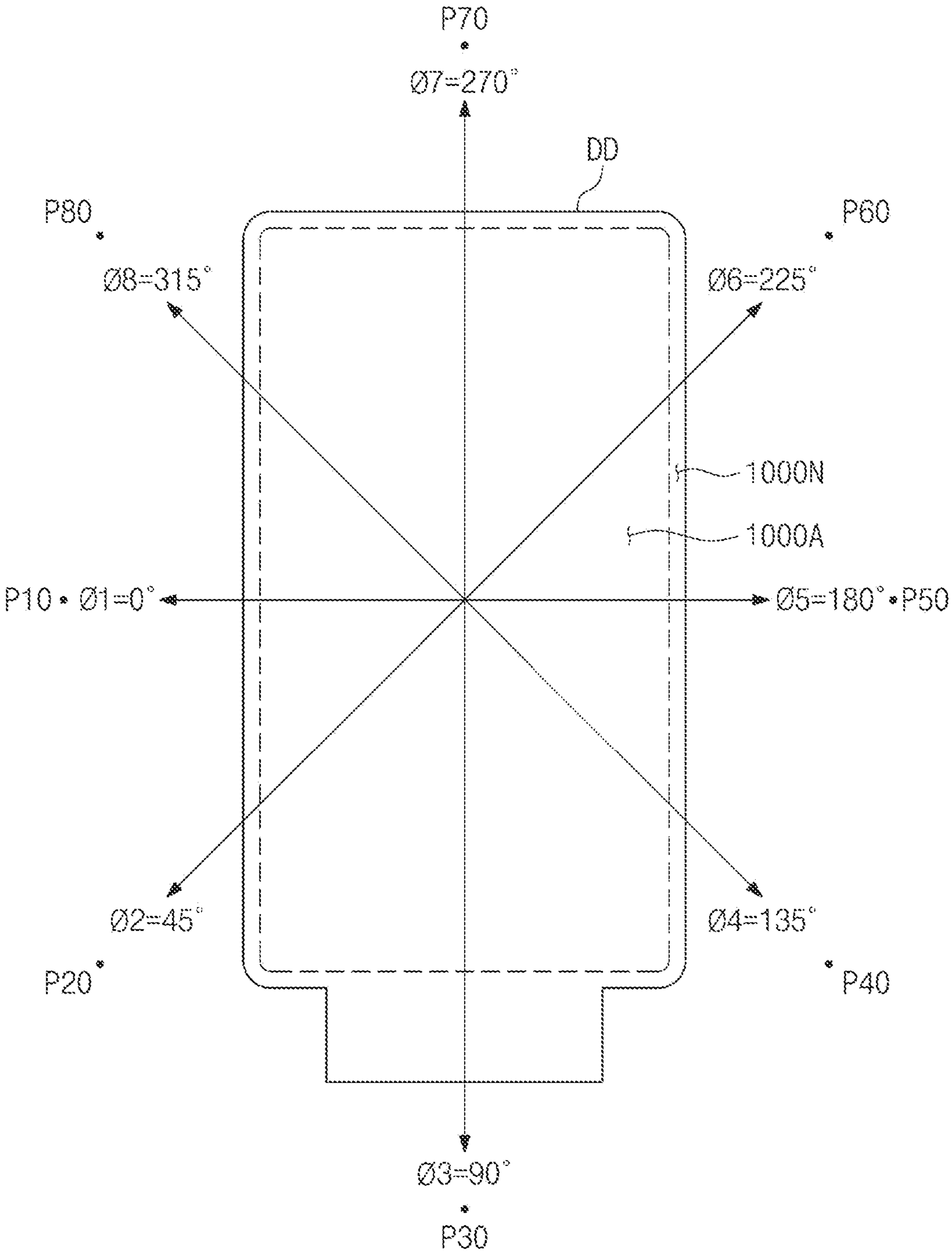
Figure 4:
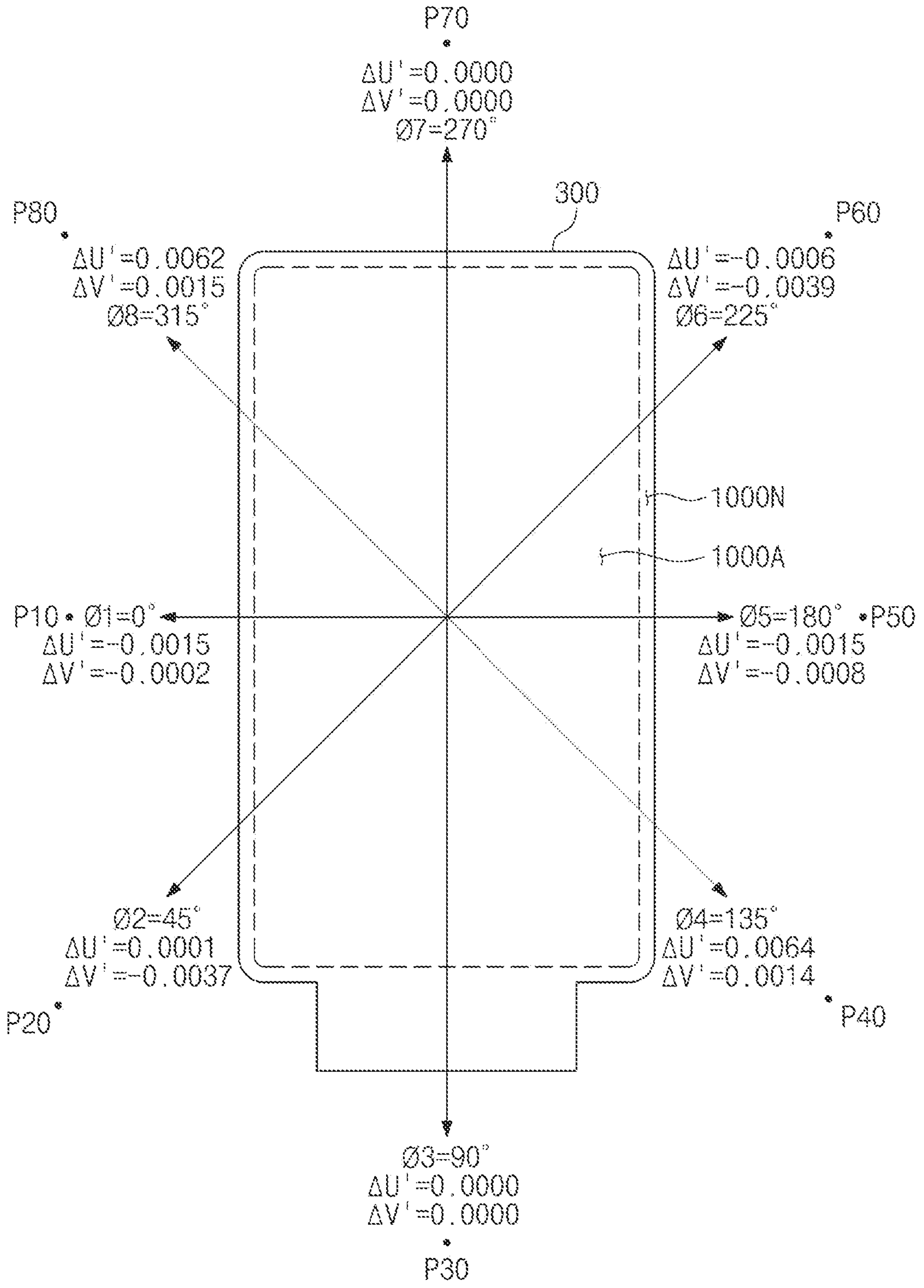
FIG. 4 is a view of a variation in color coordinates of a white image exiting from an optical film according to some embodiments.

FIGS. 3A and 3B are views of a spherical coordinate system defined in the display device DD. FIG. 4 is a view of a color coordinate change of a white image exiting through an optical film.

Referring to FIGS. 3A and 3B, the spherical coordinate system may be defined in the display device DD. An origin point of the spherical coordinate system may be aligned with a center of the display area 1000A of the display device DD. The spherical coordinate system may be used to distinguish measurement points to measure a display quality of the display device DD, and hereinafter, the measurement points may be indicated by coordinates of the spherical coordinate system.

The coordinates of the spherical coordinate system may be indicated by r, θ, and ϕ, r indicates a distance from the origin point to the measurement point, θ indicates an angle between a z-axis (or a normal axis of the display device DD) and a straight line defined between the origin point and the measurement point, and ϕ indicates an angle between an x-axis (or a horizontal axis passing through the center of the display device DD) and a straight line obtained by an orthogonal projection of the straight line defined between the origin point and the measurement point onto an x-y plane (or a front surface of the display device DD). For the convenience of explanation, θ is referred to as a viewing angle, and ϕ is referred to as an azimuth angle.

FIG. 3A shows five measurement points P1 to P5. The first viewing angle of the first measurement point may be 0°. Second, third, fourth, and fifth viewing angles θ1, θ2, θ3, θ4, and θ5 may be measured spaced apart from each other by a set or predetermined angle. The second, third, fourth, and fifth viewing angles θ1, θ2, θ3, and θ4 of the second to fifth measurement points P2 to P5 may be 15°, 30°, 45°, and 60°, respectively. According to some embodiments, the second, third, fourth, and fifth viewing angles θ1, θ2, θ3, and θ4 of the first to fifth measurement points P2 to P5 may be 20°, 40°, 60°, and 80°, respectively. According to some embodiments, the second, third, fourth, and fifth viewing angles θ1, θ2, θ3, and θ4 of the first to fifth measurement points P2 to P5 may be 10°, 20°, 30°, and 40°, respectively. FIG. 3B shows eight azimuth angles ϕ1 to ϕ8 as a representative example. The eight azimuth angles ϕ1 to ϕ8 may be 0°, 45°, 90°, 135°, 180°, 225°, 270°, and 315°, respectively.

FIG. 4 shows color coordinate changes Δu' and Δv' of the white image exiting through the optical film after a row white image is provided to the optical film of the anti-reflector 300 according to the azimuth angle. The color coordinate changes Δu' and Δv' are shown based on the eight measurement points P10 to P80, and the eight measurement points P10 to P80 may have the same distance r from the origin point to the measurement point and the same viewing angle θ.

The white image may be obtained by mixing lights generated by the pixels PX shown in FIG. 1. For example, the white image may be generated by mixing a first color light generated by first color pixels, a second color light generated by second color pixels, and a third color light generated by third color pixels. The first color light may be a red light, the second color light may be a green light, and the third color light may be a blue light. The raw white image means a white image with no difference in color coordinate changes Δu' and Δv' at the eight measurement points P10 to P80. The same type of light source as the raw white image is provided to the optical film to measure characteristics of the optical film of the anti-reflector 300.

The color coordinate changes Δu' and Δv' are expressed based on a color coordinate value measured at a third measurement point P30 having a third azimuth angle ϕ3. The color coordinate changes Δu' and Δv' are expressed based on color coordinates u' and v' of CIE1976 color coordinate system.

Referring to FIG. 4, the change Δu' of a first color coordinate measured at a fourth measurement point P40 having a fourth azimuth angle ϕ4 and an eighth measurement point P80 having an eighth azimuth angle ϕ8 is relatively large. A case where the change Δu' of the first color coordinate has a positive value and the change Δu' of the first color coordinate is large means that the white image is recognized as a reddish white to a user who views the white image passing through the optical film of the anti-reflector 300 at a corresponding measurement point. This phenomenon where the color coordinate changes Δu' and Δv' are large only at a specific point is called a white wavelength shift or a white angular dependency (WAD).

Meanwhile, a case where the change Δu' of the first color coordinate measured at a specific measurement point has a negative value and the change Δu' of the first color coordinate is large means that the white image is recognized as a greenish white image to the user. In addition, a case where the change Δv' of a second color coordinate measured at a specific measurement point has a negative value and the change Δv' of the second color coordinate is large means that the white image is recognized as a bluish white image to the user. According to some embodiments, the white image shifted to a long wavelength is described as an example of the white angular dependency (WAD), however, the white angular dependency (WAD) should not be limited thereto or thereby. As a result of the white angular dependency (WAD), the greenish white image or the bluish white image may be measured.

The color coordinate changes Δu' and Δv' of the raw white image may be larger only at the measurement point with a specific azimuth angle ϕ due to an optical axis of the optical film of the anti-reflector 300. There is a difference in the azimuth angle of about 180° between the fourth measurement point P40 where the reddish white image is measured and the eighth measurement point P80 where the reddish white image is measured, and the difference of the azimuth angle is due to the optical axis of the polarizing film included in the optical film of the anti-reflector 300. This is because a transmission axis or an absorption axis of the polarizing film has a linearity and the transmission axis or the absorption axis extends from the fourth azimuth angle ϕ4 to the eighth azimuth angle ϕ8. A path of the white image passing through the polarizing film interferes with the transmission axis or the absorption axis, and a degree of interference is different depending on the wavelength. The light having the red wavelength is provide more to a specific azimuth angle by the transmission axis or the absorption axis, and as a result, the reddish white image is measured at the specific azimuth angle.

Referring to FIG. 2, in a case where the raw white image generated by the light emitting element layer 130 is provided to the anti-reflector 300 without a substantial change while passing through the encapsulation layer 140, the input sensor 200, and the adhesive layer AD, and there is no substantial change in the raw white image even after passing through the anti-reflector 300, the user may recognize the white image described with reference to FIG. 4. That is, the user may recognize the white image in which the white angular dependency (WAD) is generated at the fourth measurement point P40 and the eighth measurement point P80.

According to some embodiments of the present disclosure, it may be possible to reduce the white angular dependency (WAD) at the fourth measurement point P40 and the eighth measurement point P80 by interfering with the white image while the white image is passing through the input sensor 200. The input sensor 200 may be designed such that an amount of interference caused by a structure of the input sensor 200 may be changed according to the azimuth angle while the first color light, the second color light, and the third color light pass through the input sensor 200. Hereinafter, the principle of controlling the amount of interference with respect to the first color light, the second color light, and the third color light according to the azimuth angle in the input sensor 200 will be explained in more detail.

Figure 5A:
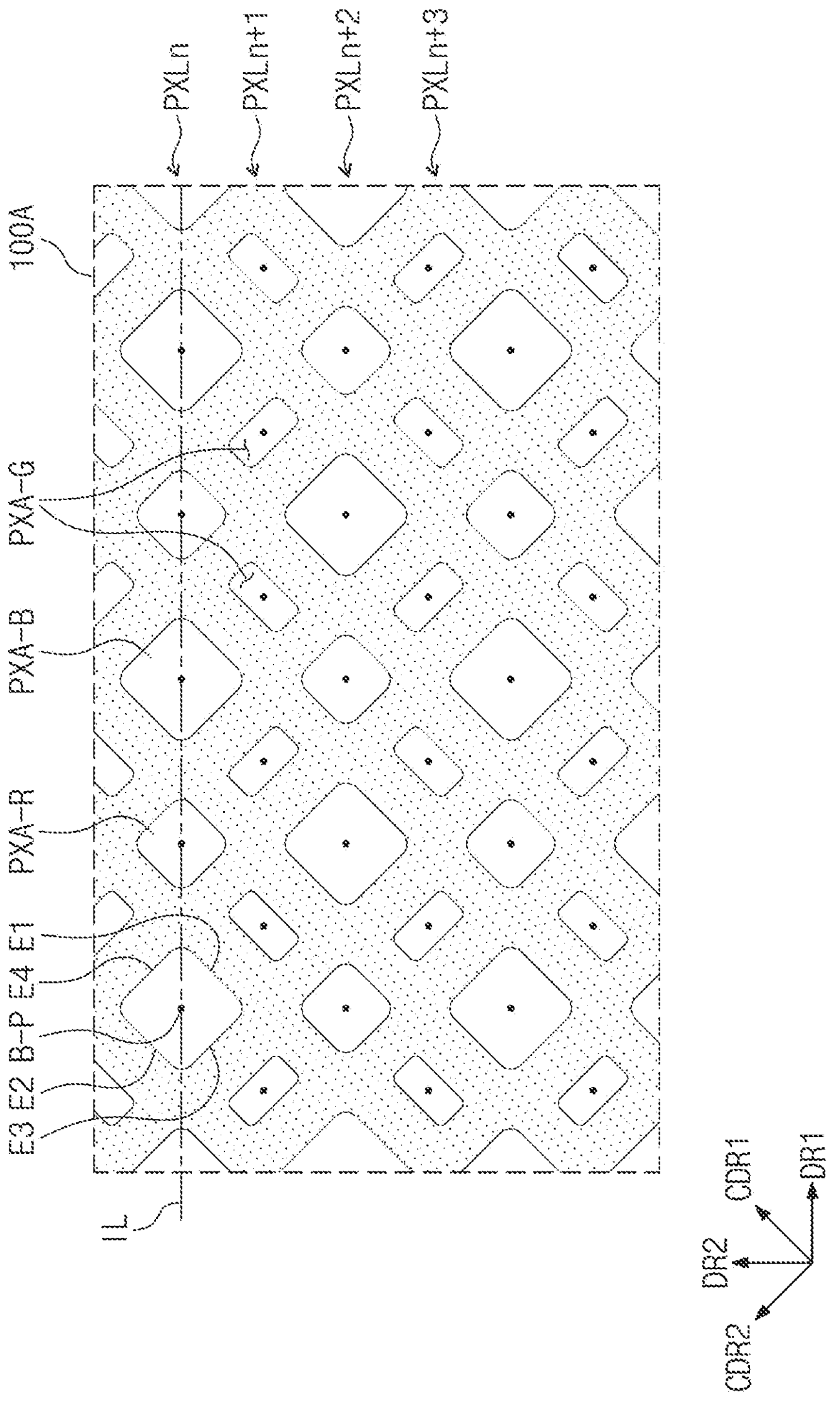
FIG. 5A is an enlarged plan view of a display area of a display panel according to some embodiments of the present disclosure.
Figure 5B:
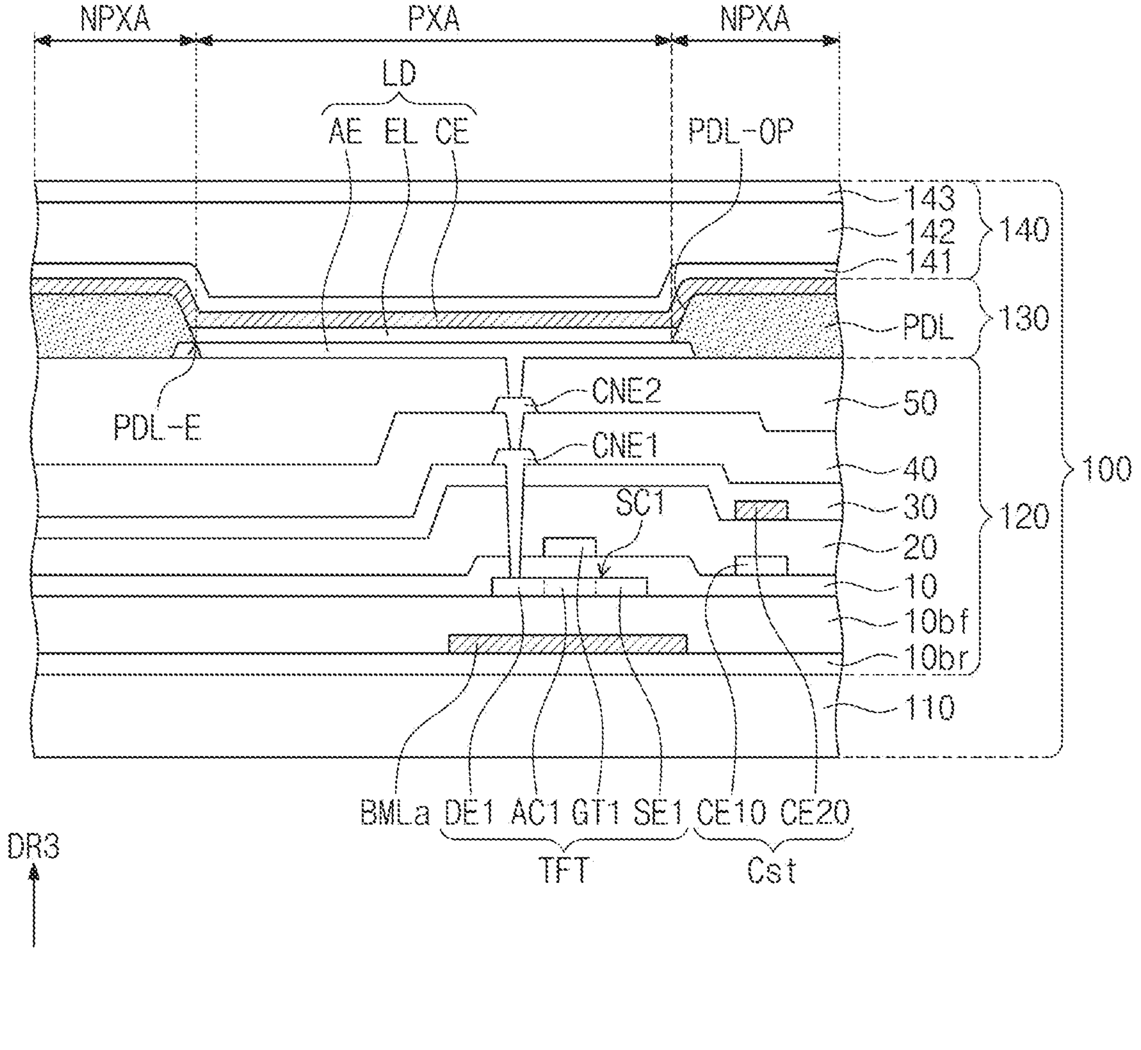
FIG. 5B is a cross-sectional view of a display area of a display panel according to some embodiments of the present disclosure.

FIG. 5A is an enlarged plan view of a display area 100A of the display panel 100 according to some embodiments of the present disclosure, and FIG. 5B is a cross-sectional view of the display area 100A of the display panel 100 according to some embodiments of the present disclosure.

Referring to FIG. 5A, the display area 100A may include a plurality of light emitting areas PXA-R, PXA-G, and PXA-B and a non-light-emitting area NPXA defined between the light emitting areas PXA-R, PXA-G, and PXA-B. The light emitting areas PXA-R, PXA-G, and PXA-B may be grouped into three groups of the light emitting areas PXA-B, PXA-R, and PXA-G. The three groups of the light emitting areas PXA-B, PXA-R, and PXA-G may be distinguished from each other according to a color of a source light generated by the light emitting element LD (refer to FIG. 5B).

A first color light emitting area PXA-R, a second color light emitting area PXA-G, and a third color light emitting area PXA-B may have different sizes from each other, however, they should not be limited thereto or thereby. According to some embodiments, the first color light emitting area PXA-R, the second color light emitting area PXA-G, and the third color light emitting area PXA-B may have same sizes from each other. According to some embodiments, the first color may be a red color, the second color may be a green color, and the third color may be a blue color. According to some embodiments, the display panel 100 may include three groups of light emitting areas respectively displaying three primary colors of yellow, magenta, and cyan.

Each of the first color light emitting area PXA-R, the second color light emitting area PXA-G, and the third color light emitting area PXA-B may have a substantially polygonal shape. According to some embodiments, the term "substantially polygonal shape" used herein includes a polygonal shape in a mathematical meaning and a polygonal shape in which curves are defined at vertices. The shape of the light emitting area may be the same as an opening defined through a pixel definition layer, and the shape of vertices may vary depending on an etching performance of the pixel definition layer.

According to some embodiments, the first color light emitting area PXA-R and the third color light emitting area PXA-B, each having a square shape, and the second color light emitting area PXA-G having a rectangular shape are shown. The second color light emitting area PXA-G may include two types of the second color light emitting areas PXA-G whose long sides extend in different directions.

Each of the first color light emitting area PXA-R, the second color light emitting area PXA-G, and the third color light emitting area PXA-B may include a first edge E1, a second edge E2, a third edge E3, and a fourth edge E4. The first edge E1 and the second edge E2 may extend in a first oblique direction CDR1 crossing the first direction DR1 and the second direction DR2 and may be spaced apart from each other with a corresponding light emitting area interposed therebetween. The third edge E3 and the fourth edge E4 may extend in a second oblique direction CDR2 crossing the first direction DR1, the second direction DR2, and the first oblique direction CDR1 and may be spaced apart from each other with a corresponding light emitting area interposed therebetween.

Referring to FIG. 5A, the light emitting areas PXA-B, PXA-R, and PXA-G may define a plurality of light emitting rows arranged in the second direction DR2. The light emitting rows may include an n-th (n is a natural number) light emitting row PXLn, an (n+1)th light emitting row PXLn+1, an (n+2)th light emitting row PXLn+2, and (n+3) th light emitting row PXLn+3. The four light emitting rows PXLn, PXLn+1, PXLn+2, and PXLn+3 may form a group and may be repeatedly arranged in the second direction DR2. Each of the four light emitting rows PXLn, PXLn+1, PXLn+2, and PXLn+3 may extend in the first direction DR1.

The n-th light emitting row PXLn may include the first color light emitting areas PXA-R and the third color light emitting areas PXA-B alternately arranged with the first color light emitting areas PXA-R in the first direction DR1. The (n+2)th light emitting row PXLn+2 may include the third color light emitting areas PXA-B and the first color light emitting areas PXA-R alternately arranged with the third color light emitting areas PXA-B in the first direction DR1.

An arrangement order of the light emitting areas in the n-th light emitting row PXLn may be different from an arrangement order of the light emitting areas in the (n+2)th light emitting row PXLn+2. The third color light emitting areas PXA-B and the first color light emitting areas PXA-R of the n-th light emitting row PXLn may be arranged in a staggered manner with respect to the third color light emitting areas PXA-B and the first color light emitting areas PXA-R of the (n+2)th light emitting row PXLn+2. The light emitting areas of the n-th light emitting row PXLn are shifted to the first direction DR1 by one light emitting area when compared with the light emitting areas of the (n+2)th light emitting row PXLn+2.

The second color light emitting areas PXA-G may be located in each of the (n+1)th light emitting row PXLn+1 and the (n+3)th light emitting row PXLn+3. The light emitting areas of the n-th light emitting row PXLn may be arranged in a staggered manner with respect to the light emitting areas of the (n+1)th light emitting row PXLn+1. The light emitting areas of the (n+2)th light emitting row PXLn+2 may be arranged in a staggered manner with respect to the light emitting areas of the (n+3)th light emitting row PXLn+3.

Center points B-P of the light emitting areas located in the light emitting row of each of the four light emitting rows PXLn, PXLn+1, PXLn+2, and PXLn+3 may be arranged on the same imaginary line IL.

As the light emitting areas PXA-R, PXA-G, and PXA-B are arranged as described above, four second color light emitting areas PXA-G may be located around one first color light emitting area PXA-R. Two second color light emitting areas PXA-G may face each other with first color light emitting area PXA-R interposed therebetween in the first oblique direction CDR1, and the other two second color light emitting areas PXA-G may face each other with the first color light emitting area PXA-R interposed therebetween in the second oblique direction CDR2. In addition, four second color light emitting areas PXA-G may be arranged around one third color light emitting area PXA-B. Two second color light emitting areas PXA-G may face each other with the third color light emitting area PXA-B interposed therebetween in the first oblique direction CDR1, and the other two second color light emitting areas PXA-G may face each other with the third color light emitting area PXA-B interposed therebetween in the second oblique direction CDR2.

FIG. 5B shows a cross-section of the display panel 100 corresponding to one light emitting area PXA and the non-light-emitting area NPXA around the light emitting area PXA. FIG. 5B shows the light emitting element LD and a transistor TFT connected to the light emitting element LD. The transistor TFT may be one of a plurality of transistors included in the driving circuit of the pixels PX (refer to FIG. 1). According to some embodiments, the transistor TFT will be described as a silicon transistor, however, according to some embodiments, the transistor TFT may be a metal oxide transistor.

A barrier layer 10*br* may be located on the base layer 110. The barrier layer 10*br* may prevent or reduce a foreign substance or contaminant from entering thereinto from the outside. The barrier layer 10*br* may include at least one inorganic layer. The barrier layer 10*br* may include a silicon oxide layer and a silicon nitride layer. Each of the silicon oxide layer and the silicon nitride layer may be provided in plural, and the silicon oxide layers and the silicon nitride layers may be alternately stacked with each other.

A shielding electrode BMLa may be located on the barrier layer 10*br*. The shielding electrode BMLa may include a metal material. The shielding electrode BMLa may include molybdenum (Mo), an alloy including molybdenum (Mo), titanium (Ti), or an alloy including titanium (Ti), which has a good heat resistance. The shielding electrode BMLa may receive a bias voltage.

The shielding electrode BMLa may prevent or reduce instances of an electric potential caused by a polarization phenomenon exerting influence on the silicon transistor TFT. The shielding electrode BMLa may prevent or reduce instances of an external light reaching the silicon transistor TFT. According to some embodiments, the shielding electrode BMLa may be a floating electrode isolated from other electrodes or lines.

A buffer layer 10*bf* may be located on the barrier layer 10*br*. The buffer layer 10*bf* may prevent or reduce metal atoms or impurities or other contaminants from being diffused to a semiconductor pattern SC1 located thereon from the base layer 110. The buffer layer 10*bf* may include at least one inorganic layer. The buffer layer 10*bf* may include a silicon oxide layer and a silicon nitride layer.

The semiconductor pattern SC1 may be located on the buffer layer 10*bf*. The semiconductor pattern SC1 may include a silicon semiconductor. As an example, the silicon semiconductor may include amorphous silicon or polycrystalline silicon. For example, the semiconductor pattern SC1 may include low temperature polycrystalline silicon.

The semiconductor pattern may include a first region having a relatively high conductivity and a second region having a relatively low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or a signal line. The second region may substantially correspond to an active area (or a channel) of the transistor. In other words, a portion of the semiconductor pattern may be the active area of the transistor, another portion of the semiconductor pattern may be a source area or a drain area of the transistor, and the other portion of the semiconductor pattern may be a connection electrode or a connection signal line.

A source area SE1 (or a source), an active area AC1 (or a channel), and a drain area DE1 (or a drain) of the transistor TFT may be formed from the semiconductor pattern. The source area SE1 and the drain area DE1 may extend in opposite directions to each other from the active area AC1 in a cross-section.

A first insulating layer 10 may be located on the buffer layer 10*bf*. The first insulating layer 10 may commonly overlap the pixels PX (refer to FIG. 1) and may cover the semiconductor pattern. The first insulating layer 10 may include an inorganic layer and/or an organic layer and may have a single-layer or multi-layer structure. The inorganic layer may include at least one of aluminum oxide, titanium oxide, silicon oxide, silicon nitride, silicon oxynitride, zirconium oxide, or hafnium oxide. According to some embodiments, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, embodiments according to the present disclosure are not limited thereto or thereby.

A gate GT1 of the transistor TFT may be located on the first insulating layer 10. The gate GT1 may be a portion of a metal pattern. The gate GT1 may overlap the active area AC1. The gate GT1 may be used as a mask in a process of doping the semiconductor pattern. The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, however, it should not be particularly limited.

A second insulating layer 20 may be located on the first insulating layer 10 and may cover the gate GT1. A third insulating layer 30 may be located on the second insulating layer 20. A second electrode CE20 of a storage capacitor Cst may be located between the second insulating layer 20 and the third insulating layer 30. In addition, a first electrode CE10 of the storage capacitor Cst may be located between the first insulating layer 10 and the second insulating layer 20.

A first connection electrode CNE1 may be located on the third insulating layer 30. The first connection electrode CNE1 may be connected to the drain area DE1 of the transistor TFT via a contact hole defined through the first, second, and third insulating layers 10, 20, and 30.

A fourth insulating layer 40 may be located on the third insulating layer 30. A second connection electrode CNE2 may be located on the fourth insulating layer 40. The second connection electrode CNE2 may be connected to the first connection electrode CNE1 via a contact hole defined through the fourth insulating layer 40. A fifth insulating layer 50 may be located on the fourth insulating layer 40 and may cover the second connection electrode CNE2. The stack structure of the first insulating layer 10 to the fifth insulating layer 50 is merely an example, and additional conductive layer and insulating layer may be located in addition to the first insulating layer 10 to the fifth insulating layer 50.

Each of the fourth insulating layer 40 and the fifth insulating layer 50 may include an organic layer. As an example, the organic layer may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light emitting element LD may include a first electrode AE (or a pixel electrode), a light emitting layer EL, and a second electrode CE (or a common electrode). The first electrode AE may be located on the fifth insulating layer 50. The first electrode AE may be a semi-transmissive electrode, a transmissive electrode, or a reflective electrode. According to some embodiments, the first electrode AE may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO) or indium oxide (In2O3), and aluminum-doped zinc oxide (AZO). For instance, the first electrode AE may have a stack structure of ITO/Ag/ITO.

The pixel definition layer PDL may be located on the fifth insulating layer 50. The pixel definition layer PDL may have a light absorbing property. For example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof. The pixel definition layer PDL may correspond to a light blocking pattern having a light blocking property.

The pixel definition layer PDL may cover a portion of the first electrode AE. As an example, an opening PDL-OP may be defined through the pixel definition layer PDL to expose a portion of the first electrode AE. The opening PDL-OP of the pixel definition layer PDL may define the light emitting area PXA. According to some embodiments, the pixel definition layer PDL may be provided with a first color opening, a second color opening, and a third color opening defined therethrough to respectively correspond to the first color light emitting area PXA-R (refer to FIG. 5A), the second color light emitting area PXA-G (refer to FIG. 5A), and the third color light emitting area PXA-B (refer to FIG. 5A). When the pixel definition layer PDL is not formed, the light emitting area PXA may be defined the same as the first electrode AE.

The pixel definition layer PDL may increase a distance between an edge of the first electrode AE and the second electrode CE. Accordingly, it may be possible to prevent or reduce instances of an arc from occurring in the edge of the first electrode AE by the pixel definition layer PDL.

According to some embodiments, a hole control layer may be located between the first electrode AE and the light emitting layer EL. The hole control layer may include a hole transport layer and may further include a hole injection layer. An electron control layer may be located between the light emitting layer EL and the second electrode CE. The electron control layer may include an electron transport layer and may further include an electron injection layer.

The encapsulation layer 140 may be located on the light emitting element layer 130. The encapsulation layer 140 may include an inorganic layer 141, an organic layer 142, and an inorganic layer 143, which are sequentially stacked, however, layers forming the encapsulation layer 140 should not be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, it should not be particularly limited.

Figure 6A:
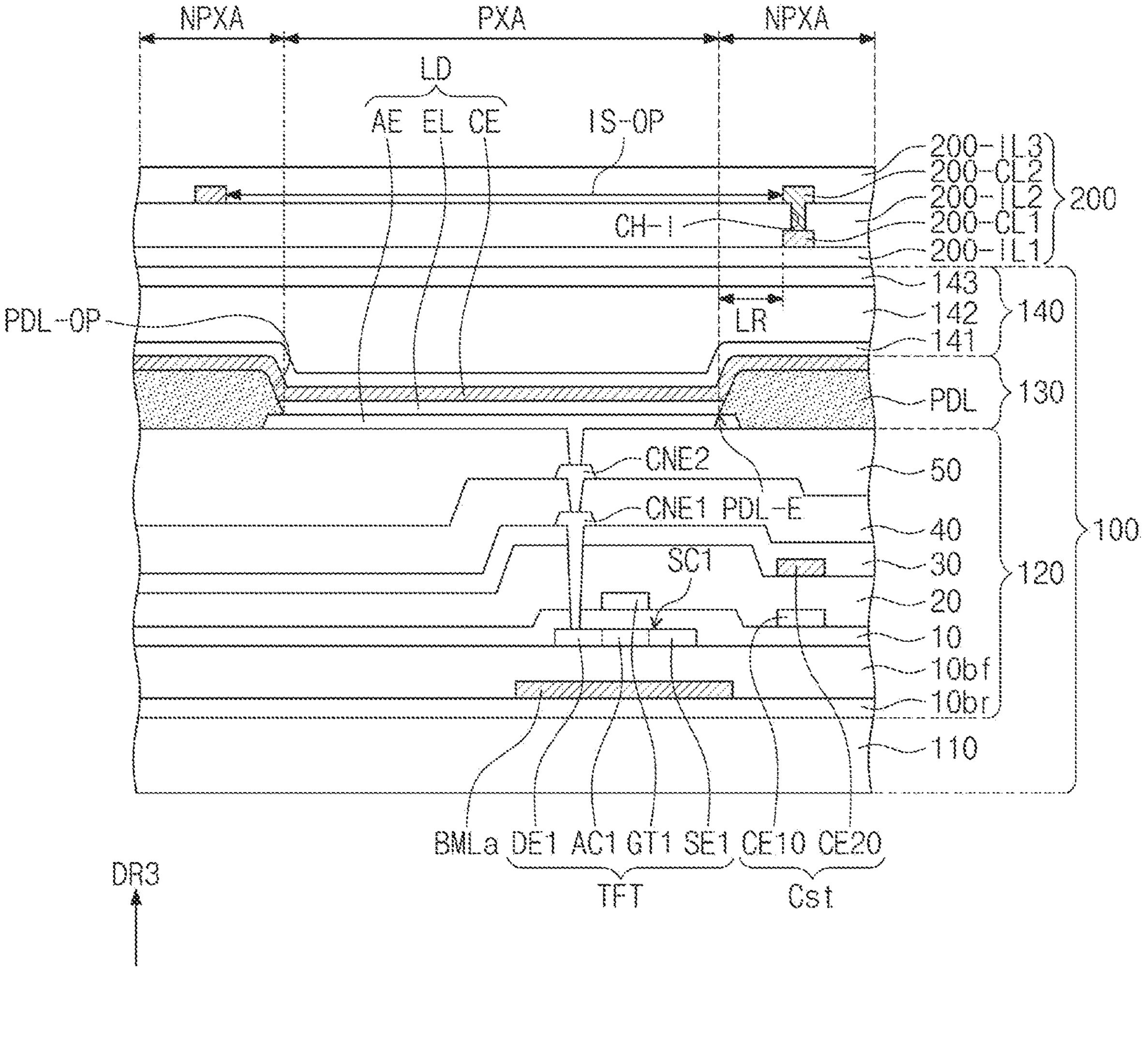
FIG. 6A is a cross-sectional view of an input sensor according to some embodiments of the present disclosure.
Figure 6B:
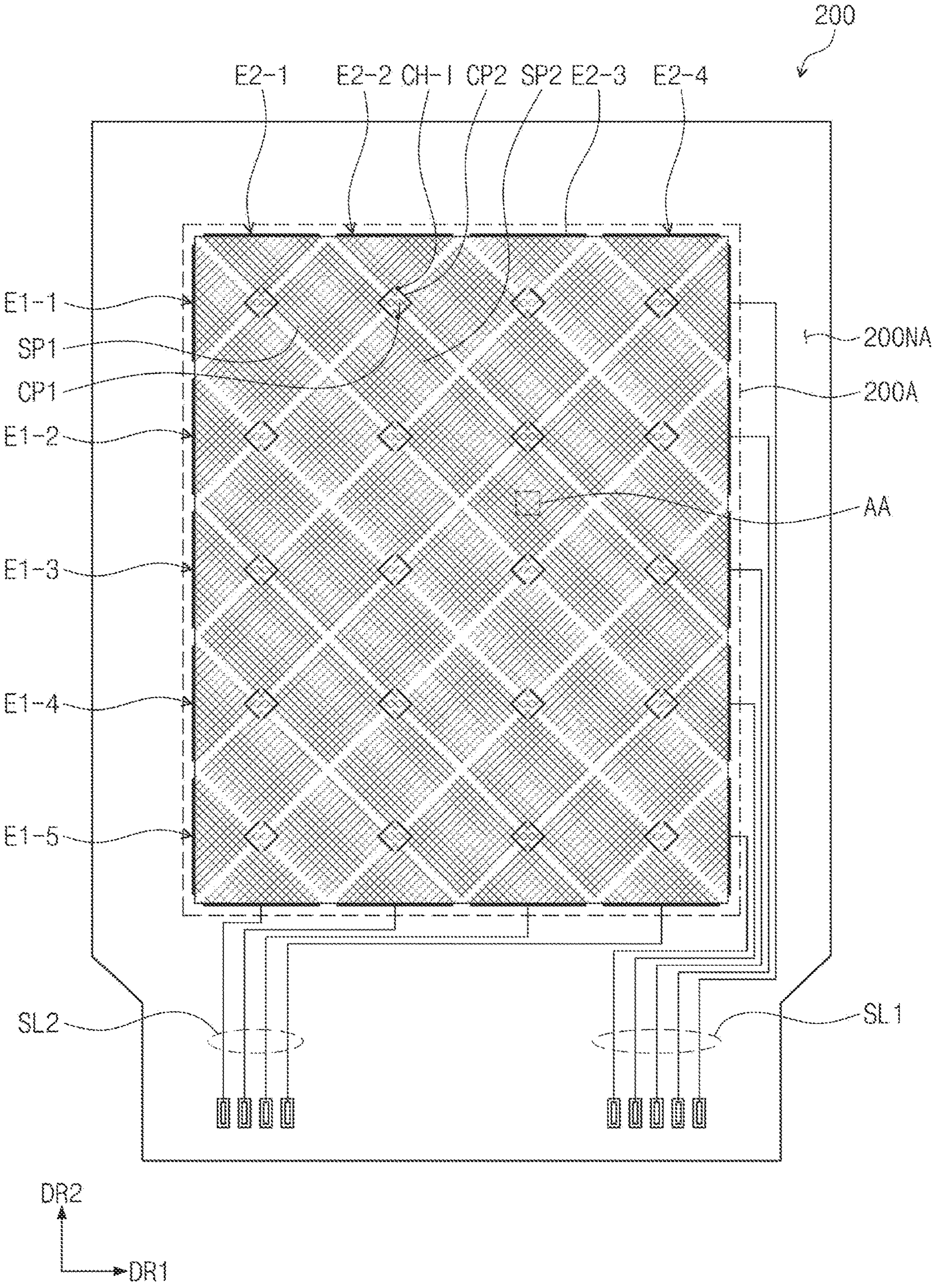
FIG. 6B is a plan view of an input sensor according to some embodiments of the present disclosure.
Figure 6C:
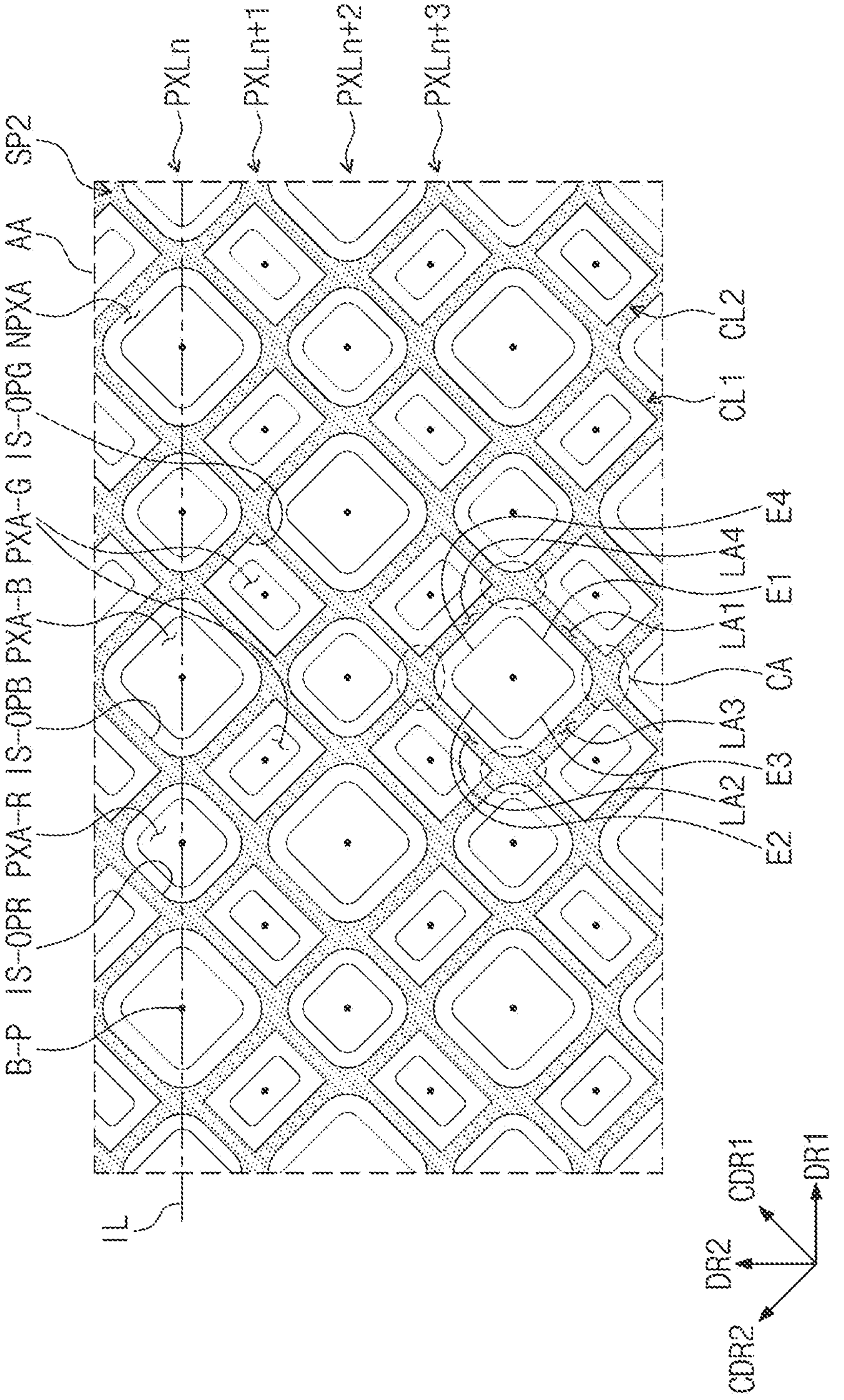
FIG. 6C is an enlarged plan view of a portion of the input sensor of FIG. 6B.

FIG. 6A is a cross-sectional view of the input sensor 200 according to some embodiments of the present disclosure. FIG. 6B is a plan view of the input sensor 200 according to some embodiments of the present disclosure. FIG. 6C is an enlarged plan view of a portion AA of the input sensor 200 of FIG. 6B.

The input sensor 200 may be located directly on the display panel 100. The input sensor 200 may include a first insulating layer 200-IL1 (or a base insulating layer), a first conductive pattern layer 200-CL1, a second insulating layer 200-IL2 (or an intermediate insulating layer), a second conductive pattern layer 200-CL2, and a third insulating layer 200-IL3 (or a cover insulating layer). The first insulating layer 200-IL1 may be located directly on the encapsulation layer 140.

According to some embodiments, the first insulating layer 200-IL1 and/or the third insulating layer 200-IL3 may be omitted. When the first insulating layer 200-IL1 is omitted, the first conductive pattern layer 200-CL1 may be located directly on an uppermost insulating layer of the encapsulation layer 140. The third insulating layer 200-IL3 may be replaced with an adhesive layer or the insulating layer of an anti-reflector 300 located on the input sensor 200.

The first conductive pattern layer 200-CL1 may include a first conductive pattern, and the second conductive pattern layer 200-CL2 may include a second conductive pattern. Each of the first conductive pattern and the second conductive pattern may include patterns regularly arranged. Hereinafter, the first conductive pattern layer 200-CL1 and the first conductive pattern are assigned with the same reference numeral, and the second conductive pattern layer 200-CL2 and the second conductive pattern are assigned with the same reference numeral.

Referring to FIG. 6A, the first conductive pattern 200-CL1 and the second conductive pattern 200-CL2 may overlap the non-light-emitting area NPXA. The first conductive pattern 200-CL1 may be provided with an opening IS-OP defined therethrough to correspond to the light emitting area PXA.

Each of the first conductive pattern 200-CL1 and the second conductive pattern 200-CL2 may have a single-layer structure or may have a multi-layer structure of layers stacked along the third direction DR3. The multi-layered conductive pattern may include at least two layers among transparent conductive layers and metal layers. The multi-layered conductive pattern may include the metal layers containing different metal materials from each other. The transparent conductive layer may include indium tin oxide (ITO), indium zinc oxide (IZO), zinc oxide (ZnO), indium tin zinc oxide (ITZO), PEDOT, a metal nanowire, or graphene. The metal layer may include molybdenum, silver, titanium, copper, aluminum, and alloys thereof.

According to some embodiments, each of the first insulating layer 200-IL1, the second insulating layer 200-IL2, and the third insulating layer 200-IL3 may include an inorganic layer and/or an organic layer. According to some embodiments, the first insulating layer 200-IL1, the second insulating layer 200-IL2, and the third insulating layer 200-IL3 may include the inorganic layer. The inorganic layer may include silicon oxide, silicon nitride, or silicon oxynitride.

According to some embodiments, at least one of the first insulating layer 200-IL1, the second insulating layer 200-IL2, or the third insulating layer 200-IL3 may be the organic layer. For instance, the third insulating layer 200-IL3 may include the organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Referring to FIG. 6B, the input sensor 200 may include a sensing area 200A and a non-sensing area 200NA adjacent to the sensing area 200A. The sensing area 200A and the non-sensing area 200NA may correspond to the display area 1000A and the non-display area (or peripheral area) 1000N shown in FIG. 1, respectively.

The input sensor 200 may include first sensing electrodes E1-1 to E1-5 and second sensing electrodes E2-1 to E2-4, which are located in sensing area 200A and are insulated from each other while crossing each other. The external input may be sensed by calculating a variation in mutual capacitance formed between the first sensing electrodes E1-1 to E1-5 and the second sensing electrodes E2-1 to E2-4.

The input sensor 200 may include first signal lines SL1 located in the non-sensing area 200NA and electrically connected to the first sensing electrodes E1-1 to E1-5 and second signal lines SL2 located in the non-sensing area 200NA and electrically connected to the second sensing electrodes E2-1 to E2-4. The first sensing electrodes E1-1 to E1-5, the second sensing electrodes E2-1 to E2-4, the first signal lines SL1, and the second signal lines SL2 may be defined by each of the first conductive pattern 200-CL1 and the second conductive pattern 200-CL2 or a combination of the first conductive pattern 200-CL1 and the second conductive pattern 200-CL2, which are described with reference to FIG. 6A.

Each of the first sensing electrodes E1-1 to E1-5 and the second sensing electrodes E2-1 to E2-4 may include a conductive line. The conductive line may define a plurality of openings. Each of the openings may be defined as the opening IS-OP shown in FIG. 6A.

Each of the first sensing electrodes E1-1 to E1-5 and the second sensing electrodes E2-1 to E2-4 may include a plurality of conductive lines crossing each other. The conductive lines may define a plurality of openings, and each of the first sensing electrodes E1-1 to E1-5 and the second sensing electrodes E2-1 to E2-4 may have a mesh shape.

One of the first sensing electrodes E1-1 to E1-5 and the second sensing electrodes E2-1 to E2-4 may be provided integrally. According to some embodiments, the first sensing electrodes E1-1 to E1-5 are integrally provided. The first sensing electrodes E1-1 to E1-5 may include sensing portions SP1 and intermediate portions CP1. A portion of the second conductive pattern 200-CL2 may correspond to the first sensing electrodes E1-1 to E1-5.

Each of the second sensing electrodes E2-1 to E2-4 may include sensing patterns SP2 and bridge patterns CP2 (or connection patterns). Two sensing patterns SP2 adjacent to each other may be connected to two bridge patterns CP2 via a contact hole CH-I defined through the second insulating layer 200-IL2 (refer to FIG. 6A), however, the number of the bridge patterns should not be particularly limited. A portion of the second conductive pattern 200-CL2 (refer to FIG. 6A) may correspond to the sensing patterns SP2. A portion of the first conductive pattern 200-CL1 (refer to FIG. 6A) may correspond to the bridge patterns CP2.

According to some embodiments, the bridge patterns CP2 are formed from the first conductive pattern 200-CL1 shown in FIG. 6A, and the first sensing electrodes E1-1 to E1-5 and the sensing patterns SP2 are formed from the second conductive pattern 200-CL2, however, they should not be limited thereto or thereby. According to some embodiments, the first sensing electrodes E1-1 to E1-5 and the sensing patterns SP2 may be formed from the first conductive pattern 200-CL1 shown in FIG. 6A, and the bridge patterns CP2 may be formed from the second conductive pattern 200-CL2.

One of the first signal lines SL1 and the second signal lines SL2 may transmit a transmission signal to sense an external input from an external circuit, and the other of the first signal lines SL1 and the second signal lines SL2 may transmit the variation in capacitance between the first sensing electrodes E1-1 to E1-5 and the second sensing electrodes E2-1 to E2-4 to the external circuit as a reception signal.

A portion of the second conductive pattern 200-CL2 may correspond to the first signal lines SL1 and the second signal lines SL2. The first signal lines SL1 and the second signal lines SL2 may have a multi-layer structure and may include a first layer line formed from the first conductive pattern 200-CL1 and a second layer line formed from the second conductive pattern 200-CL2. The first layer line and the second layer line may be connected to each other via a contact hole defined through the second insulating layer 200-IL2 (refer to FIG. 6A).

FIG. 6C is an enlarged plan view showing the sensing pattern SP2 to explain the first sensing electrodes E1-1 to E1-5 and the second sensing electrodes E2-1 to E2-4, which have the mesh shape shown in FIG. 6B. Other portions of the first sensing electrodes E1-1 to E1-5 and the second sensing electrodes E2-1 to E2-4, may have substantially the same shape as that of the sensing pattern SP2 shown in FIG. 6C.

According to some embodiments, a disconnection area of the conductive lines CL1 and CL2 shown in FIG. 6C may be defined at a boundary between the first sensing electrodes E1-1 to E1-5 and the second sensing electrodes E2-1 to E2-4.

Referring to FIG. 6C, first, second, and third openings IS-OPR, IS-OPG, and IS-OPB may be defined through the sensing pattern SP2 to correspond to the first, second, and third color light emitting areas PXA-R, PXA-G, and PXA-B. The sensing pattern SP2 may include the first lines CL1 extending in the first oblique direction CDR1 and overlapping the non-light-emitting area NPXA and the second lines CL2 extending in the second oblique direction CDR2 and overlapping the non-light-emitting area NPXA. The first lines CL1 and the second lines CL2 may cross each other to define the first, second, and third openings IS-OPR, IS-OPG, and IS-OPB respectively corresponding to the first, second, and third color light emitting areas PXA-R, PXA-G, and PXA-B. Accordingly, the sensing pattern SP2 may have a grid shape or a mesh shape. However, each of the first lines CL1 may not have a perfect straight line shape in the first oblique direction CDR1 and may include a plurality of straight line areas and a plurality of curved line areas. The second lines CL2 may also include a plurality of straight line areas and a plurality of curved line areas.

The sensing pattern SP2 may include a first line area LA1 and a second line area LA2, which face each other in the second oblique direction CDR2, and a third line area LA3 and a fourth line area LA4, which face each other in the first oblique direction CDR1, with respect to each of the first, second, and third openings IS-OPR, IS-OPG, and IS-OPB. The first line area LA1 and the second line area LA2 may be portions of the first lines CL1, and the third line area LA3 and the fourth line area LA4 may be portions of the second lines CL2. Each of the first line area LA1, the second line area LA2, the third line area LA3, and the fourth line area LA4 may have a uniform line width. Each of the first line area LA1, the second line area LA2, the third line area LA3, and the fourth line area LA4 may have the line width from about 2 micrometers to about 8 micrometers.

The first line area LA1, the second line area LA2, the third line area LA3, and the fourth line area LA4 may be arranged respectively adjacent to the first edge E1, the second edge E2, the third edge E3, and the fourth edge E4. The first line area LA1, the second line area LA2, the third line area LA3, and the fourth line area LA4 may be arranged to be substantially parallel to the first edge E1, the second edge E2, the third edge E3, and the fourth edge E4, respectively.

According to some embodiments, a distance between the line area and the edge corresponding to the line area is uniform in the sensing pattern SP2, however, it should not be limited thereto or thereby. In a case where each of the first, second, and third color light emitting areas PXA-R, PXA-G, and PXA-B has a shape different from that of a corresponding opening among the first, second, and third openings IS-OPR, IS-OPG, and IS-OPB, the distance between the line area and the edge may not be uniform.

A cross area CA may be defined between the line areas adjacent to each other. The cross area CA may have a line width greater than that of at least the line area adjacent thereto. When comparing the line width of the first line area LA1 with the line width of the cross area CA defined between the first line area LA1 and the third line area LA3, the same result as the above description may be obtained.

Figure 7:
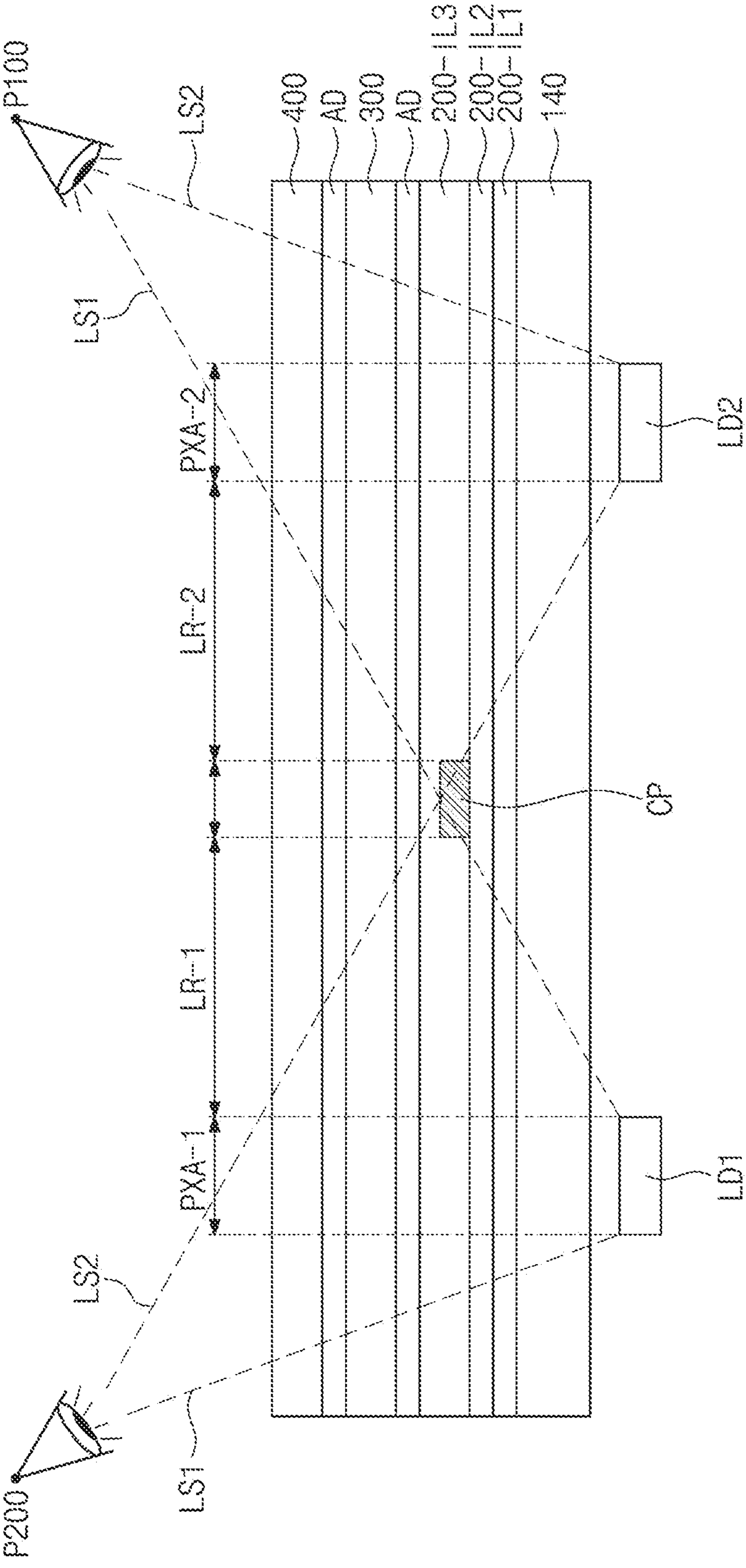
FIG. 7 is a cross-sectional view of a radiation path of a source light.

FIG. 7 is a cross-sectional view of a radiation path of a source light.

FIG. 7 shows two light emitting elements LD1 and LD2 and a conductive pattern CP located between the light emitting elements LD1 and LD2 when viewed in a plan view. Two light emitting areas PXA-1 and PXA-2 corresponding to the light emitting elements LD1 and LD2 are shown. The two light emitting areas PXA-1 and PXA-2 may be the first color light emitting area PXA-R and the second color light emitting area PXA-G or the third color light emitting area PXA-B and the second color light emitting area PXA-G shown in FIG. 6C. The conductive pattern CP may correspond to one of the first line area LA1, the second line area LA2, the third line area LA3, and the fourth line area LA4 shown in FIG. 6C.

FIG. 7 shows the input sensor 200 in more detail compared to the display device DD shown in FIG. 2. A first source light LS1 emitted from the first light emitting element LD1 and a second source light LS2 emitted from the second light emitting element LD2 may be emitted to the front of the display device DD. The conductive pattern CP may correspond to a shielding pattern that shields the source lights LS1 and LS2.

The conductive pattern CP may block the first source light LS1 provided to a first measurement point P100. The conductive pattern CP may block the second source light LS2 provided to a second measurement point P200. An amount of the first source light LS1 provided to the first measurement point P100 may be controlled depending on a distance LR-1 (hereinafter, referred to as a first distance) between a first light emitting area PXA-1 and the conductive pattern CP. When the first distance LR-1 becomes smaller than that shown in FIG. 7, the first source light LS1 may be more blocked, and thus, the amount of the first source light LS1 provided to the first measurement point P100 may decrease. On the contrary, when the first distance LR-1 becomes greater than that shown in FIG. 7, the conductive pattern CP may block only a portion of the first source light LS1, which is inclinedly emitted, and thus, the amount of the first source light LS1 provided to the first measurement point P100 may increase.

In a way similar to how the amount of the first source light LS1 provided to the first measurement point P100 is controlled by the first distance LR-1, an amount of the second source light LS2 provided to the second measurement point P200 may be controlled depending on a distance LR-2 (hereinafter, referred to as a second distance) between a second light emitting area PXA-2 and the conductive pattern CP. Although schematically illustrated in FIG. 7, the first distance LR-1 and the second distance LR-2 may be defined as a distance between an edge PDL-E of the pixel definition layer PDL defining the light emitting area PXA and an edge of the conductive pattern included in the second conductive pattern layer 200-CL2 like the distance LR shown in FIG. 6A. The edge of the conductive pattern may be an edge closest to the edge PDL-E of the pixel definition layer PDL.

According to the present disclosure, the amount of the interference with respect to the first color light, the second color light, and the third color light passing through the input sensor 200 may be controlled using a light shielding function of the conductive pattern CP described with reference to FIG. 7. This will be described in detail with reference to FIG. 8A.

Figure 8A:
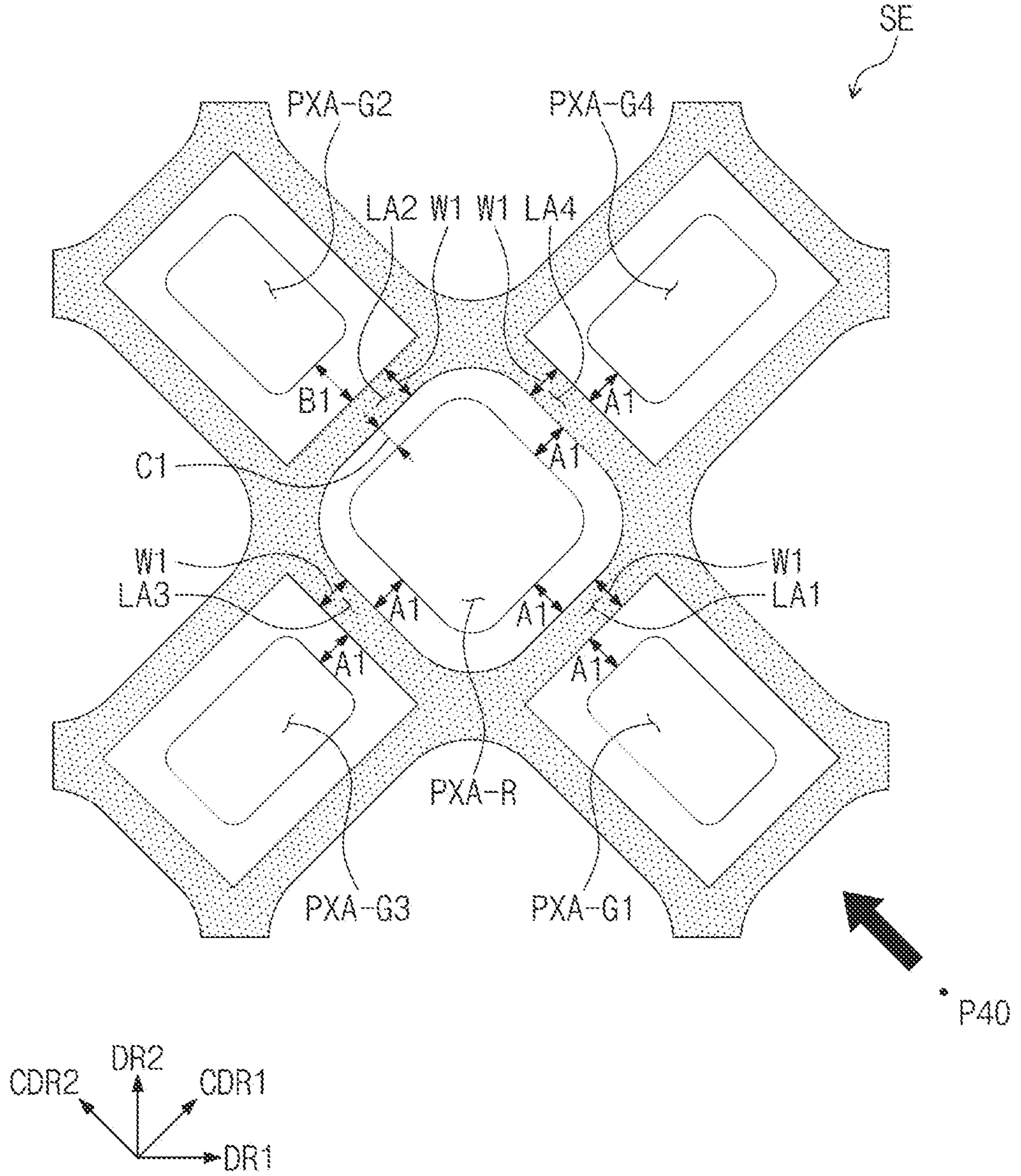
FIGS. 8A and 8B are plan views of an arrangement relationship between a light emitting area and a sensing electrode according to some embodiments of the present disclosure.
Figure 8B:
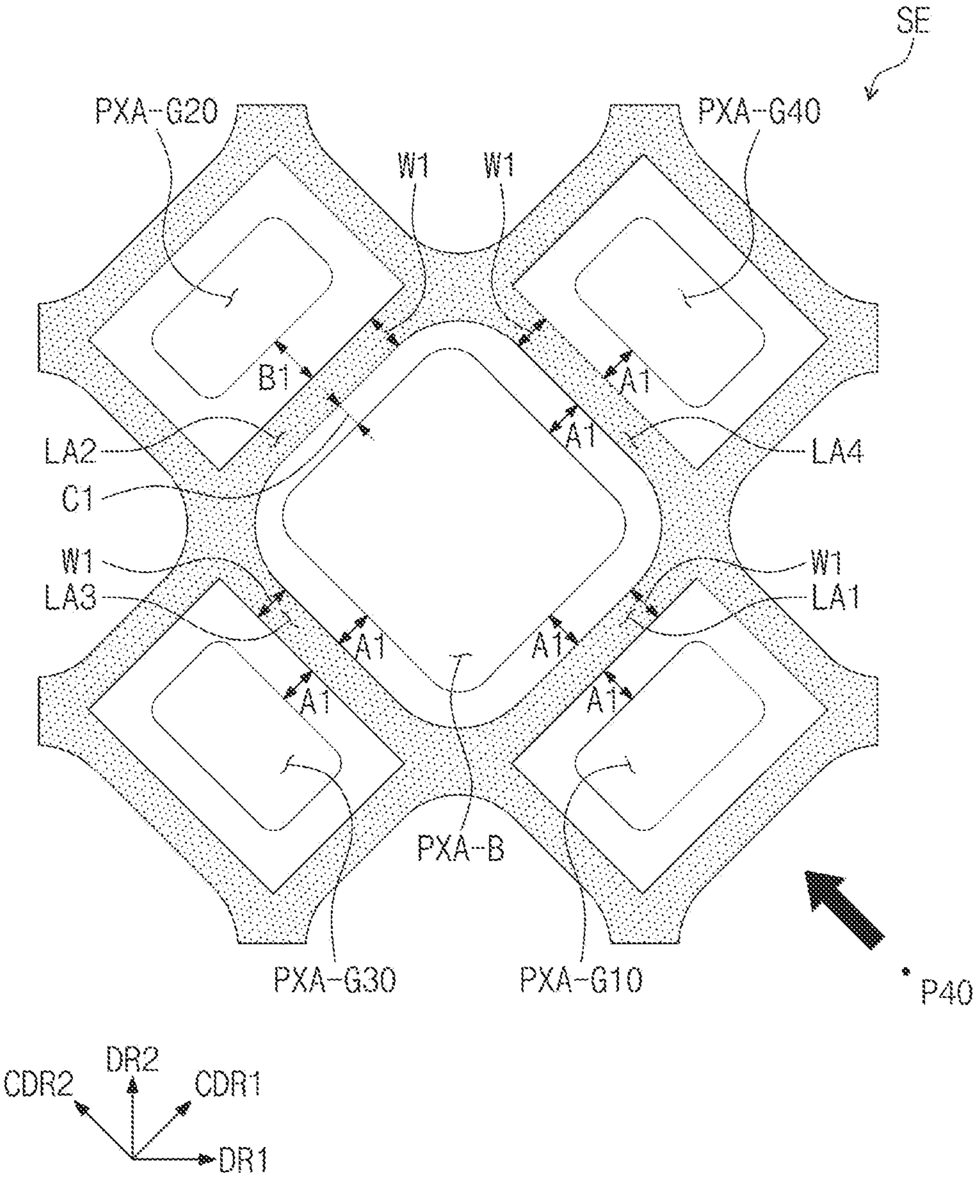

FIGS. 8A and 8B are plan views of an arrangement relationship between the light emitting areas PXA-R, PXA-G, and PXA-B and a sensing electrode SE according to some embodiments of the present disclosure.

The sensing electrode SE shown in FIGS. 8A and 8B may be different portions of the sensing portion SP2 shown in FIG. 6C and is shown in detail compared with that of FIG. 6C. FIG. 8A shows the first color light emitting area PXA-R and four second color light emitting areas PXA-G1, PXA-G2, PXA-G3, and PXA-G4 surrounding the first color light emitting area PXA-R, and FIG. 8B shows the third color light emitting area PXA-B and four second color light emitting areas PXA-G1, PXA-G2, PXA-G3, and PXA-G4 surrounding the third color light emitting area PXA-B. In FIGS. 8A and 8B, the same reference numerals denote the same elements in FIG. 6C, and thus, detailed descriptions of the same elements will be omitted.

Arrows shown in FIGS. 8A and 8B indicate a direction in which the sensing electrode SE is viewed from the fourth measurement point P40 where the white angular dependency (WAD) described in FIG. 4 is measured. According to the following descriptions, as an arrangement of the line areas LA1 to LA4 of the sensing electrode SE with respect to the light emitting areas PXA-R, PXA-G, and PXA-B is controlled, the white angular dependency (WAD) induced by the optical film described in FIGS. 2 and 4 may be compensated for by the input sensor 200 located below the optical film. Referring to FIG. 4, it may be found that the change Δu' of the first color coordinate increases in a positive direction by the anti-reflector 300 (refer to FIG. 2) at the fourth measurement point P40. When the white image (hereinafter, referred to as an incident white image) in which the change Δu' of the first color coordinate increases in a negative direction with respect to the fourth measurement point P40 is incident into the optical film, the first color coordinate u' of the incident white image with respect to the fourth measurement point P40 may be corrected by the optical film.

It may be desired to provide relatively more second color light, i.e., the green light, to the fourth measurement point P40 to provide the white image in which the change Δu' of the first color coordinate increases in the negative direction with respect to the fourth measurement point P40 to the optical film. Meanwhile, when the change Δu' of the first color coordinate increases in the negative direction by the optical film, it may be desired to provide relatively more first color light, i.e., the red light, to the fourth measurement point P40.

Referring to FIG. 8A, in the second oblique direction CDR2, two second color light emitting areas PXA-G1 and PXA-G2 may face each other, and the first color light emitting area PXA-R may be located between the two second color light emitting areas PXA-G1 and PXA-G2. The sensing electrode SE may include the first line area LA1, the second line area LA2, the third line area LA3, and the fourth line area LA4 arranged around the first color light emitting area PXA-R. The first line area LA1 may be located between a first-second color light emitting area PXA-G1 and the first color light emitting area PXA-R. The second line area LA2 may be located between a second-second color light emitting area PXA-G2 and the first color light emitting area PXA-R. According to some embodiments, each of the first line area LA1, the second line area LA2, the third line area LA3, and the fourth line area LA4 may have a line width W1 of about 3 micrometers. The line width W1 may be within a range from about 2 micrometers to about 5 micrometers.

A distance between the first color light emitting area PXA-R and the four second color light emitting areas PXA-G1 to PXA-G4 surrounding the first color light emitting area PXA-R may be substantially uniform. The distance between the first color light emitting area PXA-R and the second color light emitting areas PXA-G1 to PXA-G4 may be within a range from about 15 micrometers to about 20 micrometers.

The first line area LA1 may be spaced apart from each of the first-second color light emitting area PXA-G1 and the first color light emitting area PXA-R by the same distance A1 (hereinafter, referred to as a first distance). The first distance A1 may be within a range from about 3 micrometers to about 11 micrometers. A distance between the second-second color light emitting area PXA-G2 and the second line area LA2 may be different from a distance between the first color light emitting area PXA-R and the second line area LA2. The second line area LA2 may be spaced apart from the second-second color light emitting area PXA-G2 by a second distance B1, and the second line area LA2 may be spaced apart from the first color light emitting area PXA-R by a third distance C1. The second distance B1 may be greater than the third distance C1, and the first distance A1 may correspond to an average of the second distance B1 and the third distance C1. The second distance B1 may be greater than the third distance C1 by about 2 micrometers to about 8 micrometers. When comparing the first line area LA1 with the second line area LA2, the second line area LA2 appears shifted towards the fourth measurement point P40.

As the second line area LA2 is located relatively farther from the second-second color light emitting area PXA-G2, the second-second color light emitting area PXA-G2 may provide a larger amount of the second color light in the direction to the fourth measurement point P40. This is because a light shielding efficiency of the second line area LA2 with respect to the second color light decreases as the light shielding principle of the conductive pattern CP described with reference to FIG. 7. This effect may occur more strongly as the viewing angle described with reference to FIG. 3A increases.

Referring to FIG. 8A, the third line area LA3 may be spaced apart from a third-second color light emitting area PXA-G3 and the first color light emitting area PXA-R by the same distance. The fourth line area LA4 may be spaced apart from a fourth-second color light emitting area PXA-G4 and the first color light emitting area PXA-R by the same distance. According to some embodiments, the third line area LA3 spaced apart from the third-second color light emitting area PXA-G3 and the first color light emitting area PXA-R by the first distance A1 and the fourth line area LA4 spaced apart from the fourth-second color light emitting area PXA-G4 and the first color light emitting area PXA-R by the first distance A1 are shown as a representative example.

Referring to FIG. 8B, in the second oblique direction CDR2, two second color light emitting areas PXA-G10 and PXA-G20 may face each other, and the third color light emitting area PXA-B may be located between the two second color light emitting areas PXA-G10 and PXA-G20. The sensing electrode SE may include a first line area LA1, a second line area LA2, a third line area LA3, and a fourth line area LA4, which are arranged around the third color light emitting area PXA-B. The first line area LA1 may be located between a first-second color light emitting area PXA-G10 and the third color light emitting area PXA-B. The second line area LA2 may be located between a second-second color light emitting area PXA-G20 and the third color light emitting area PXA-B.

A distance between the third color light emitting area PXA-B and four second color light emitting areas PXA-G10 to PXA-G40 surrounding the third color light emitting area PXA-B may be uniform. The distance between the third color light emitting area PXA-B and the four second color light emitting areas PXA-G10 to PXA-G40 may be within a range from about 15 micrometers to about 20 micrometers.

The first line area LA1 may be spaced apart from the first-second color light emitting area PXA-G10 and the third color light emitting area PXA-B by the first distance A1. A distance between the second line area LA2 and the second-second color light emitting area PXA-G20 may be different from a distance between the third color light emitting area PXA-B and the second line area LA2. The second line area LA2 may be spaced apart from the second-second color light emitting area PXA-G20 by the second distance B1, and the second line area LA2 may be spaced apart from the third color light emitting area PXA-B by the third distance C1. As the second-second color light emitting area PXA-G20 is located relatively farther from the second line area LA2, the second-second color light emitting area PXA-G20 may provide a larger amount of the second color light in the direction to the fourth measurement point P40.

Referring to FIG. 8B, the third line area LA3 may be spaced apart from each of a third-second color light emitting area PXA-G30 and the third color light emitting area PXA-B by the first distance A1. The fourth line area LA4 may be spaced apart from each of a fourth-second color light emitting area PXA-G40 and the third color light emitting area PXA-B by the first distance A1.

Figure 9A:
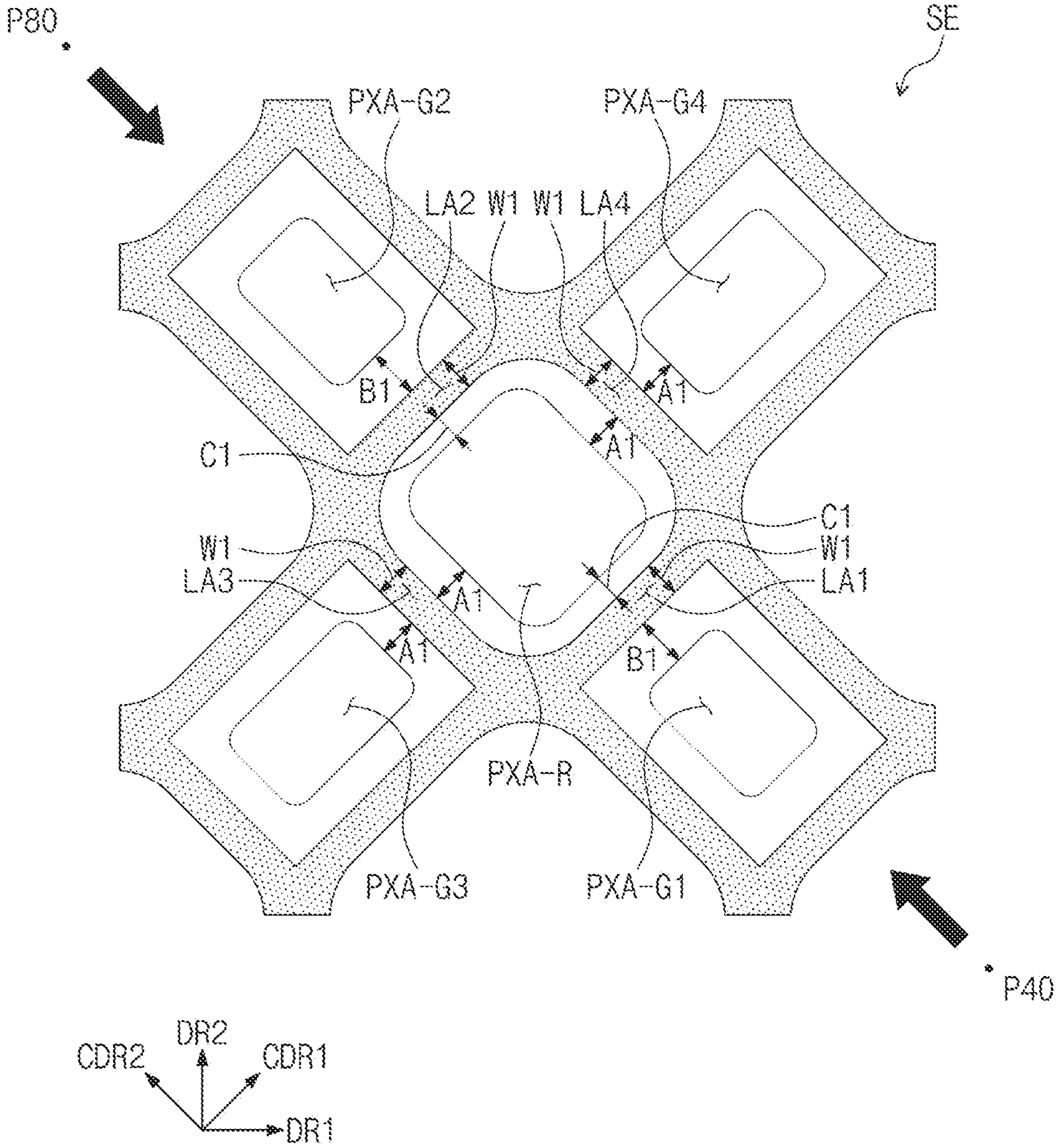
FIGS. 9A to 9C are plan views of an arrangement relationship between a light emitting area and a sensing electrode according to some embodiments of the present disclosure.
Figure 9B:
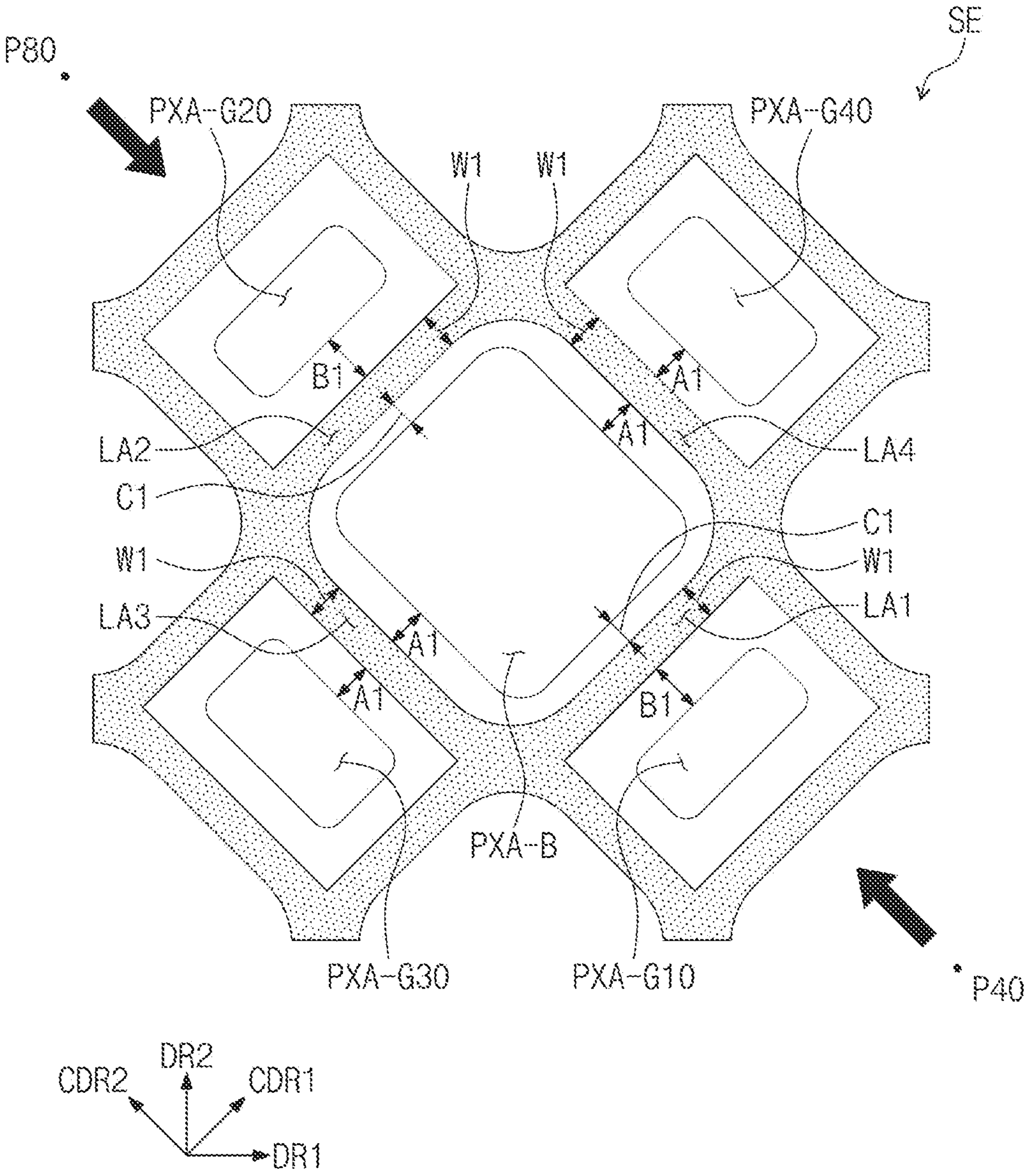
Figure 9C:
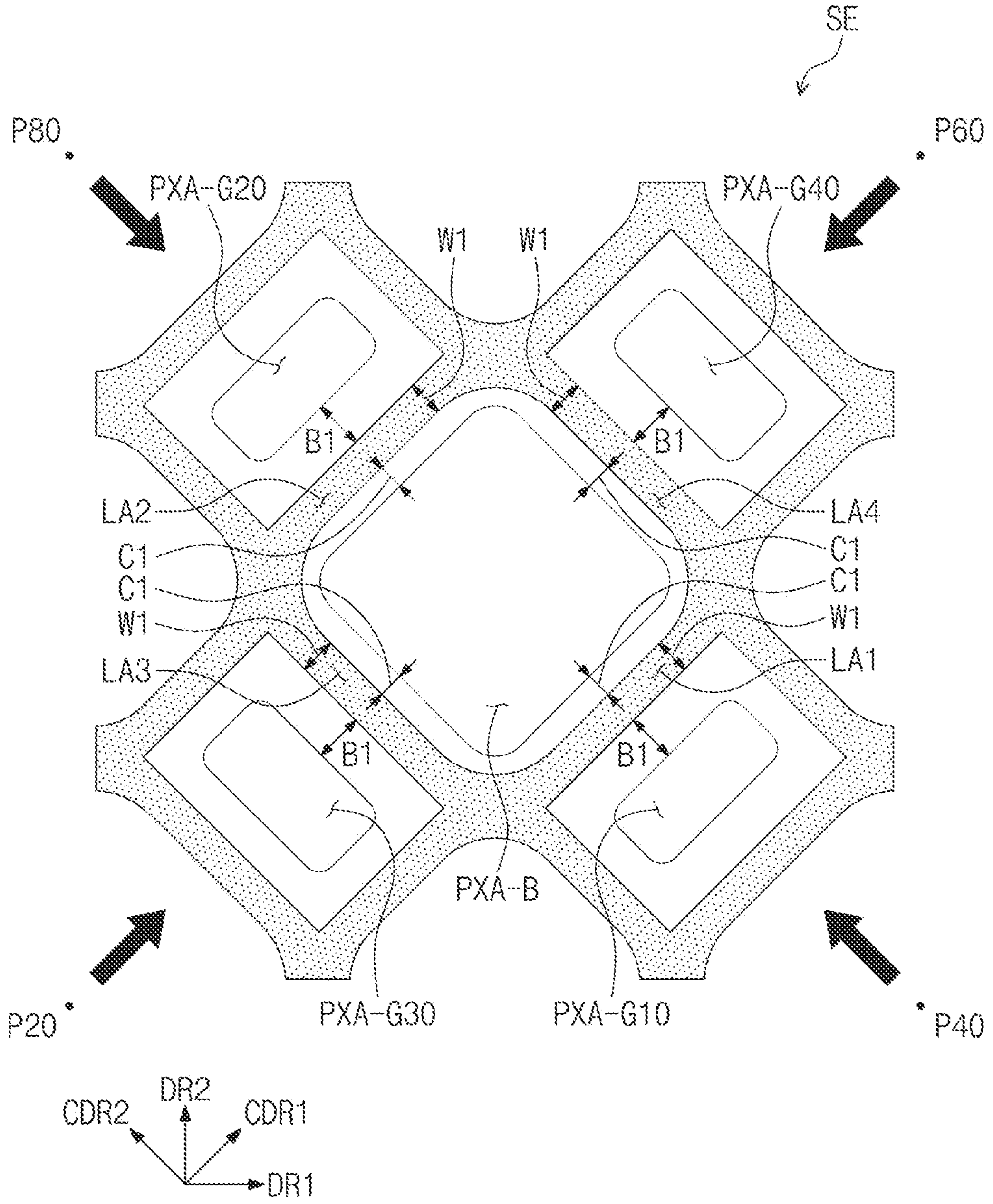

FIGS. 9A to 9C are plan views of an arrangement relationship between light emitting areas PXA-R, PXA-G, and PXA-B and a sensing electrode SE according to some embodiments of the present disclosure. In FIGS. 9A to 9C, detailed descriptions of the same elements as those of FIGS. 8A and 8B will be omitted.

Referring to FIGS. 9A to 9C, the white angular dependency (WAD) may occur at other measurement points in addition to the fourth measurement point P40 of FIGS. 8A and 8B. Referring to FIGS. 9A to 9C, the white angular dependency (WAD) may occur at an eighth measurement point P80, which has a larger azimuth angle of about 180° than that of the fourth measurement point P40. As described with reference to FIG. 4, because the optical axis of the polarizing film has the linearity, the white angular dependency (WAD) may occur symmetrically at two points whose azimuth angles are different from each other by about 180. However, the change Δu' of the first color coordinate measured at the fourth measurement point P40 may be similar to the change Δu' of the first color coordinate measured at the eighth measurement point P80, and they should not be limited to having identical values.

Referring to FIG. 9A, a distance between a first line area LA1 and a first-second color light emitting area PXA-G1 may be different from a distance between the first line area LA1 and a first color light emitting area PXA-R. The first line area LA1 may be spaced apart from the first-second color light emitting area PXA-G1 by the second distance B1, and the first line area LA1 may be spaced apart from the first color light emitting area PXA-R by the third distance C1. As the first line area LA1 is located relatively farther from the first-second color light emitting area PXA-G1, the first-second color light emitting area PXA-G1 may provide a larger amount of the second color light in a direction to the eighth measurement point P80.

Referring to FIG. 9B, a distance between a first-second color light emitting area PXA-G10 and a first line area LA1 may be different from a distance between a third color light emitting area PXA-B and the first line area LA1. The first line area LA1 may be spaced apart from the first-second color light emitting area PXA-G10 by the second distance B1, and the first line area LA1 may be spaced apart from the third color light emitting area PXA-B by the third distance C1. As the first line area LA1 is located relatively farther from the first-second color light emitting area PXA-G10, the first-second color light emitting area PXA-G10 may provide a larger amount of the second color light in a direction to the eighth measurement point P80.

According to the above, the sensing electrode SE may provide the white image in which the change Δu' of the first color coordinate increases in the negative direction with respect to the eighth measurement point P80. The change Δu' of the first color coordinate may increase in the positive direction with respect to the eighth measurement point P80 by the optical film. Consequently, the white image with reduced white angular dependency (WAD) may be measured at the eighth measurement point P80.

Referring to FIG. 9B, the first line area LA1 and a second line area LA2 may be spaced apart from the third color light emitting area PXA-B by the third distance C1, and a third line area LA3 and a fourth line area LA4 may be spaced apart from the third color light emitting area PXA-B by the first distance A1. Because the first line area LA1 and the second line area LA2 are located closer to the third color light emitting area PXA-B than the third line area LA3 and the fourth line area LA4 are, an amount of the third color light, i.e., the blue light, traveling to the fourth measurement point P40 and the eighth measurement point P80 may decrease. This means that the second color coordinate measured at the fourth measurement point P40 and the eighth measurement point P80 may have a relatively low value.

FIG. 9C shows a sensing electrode SE different from that of FIG. 9B. When compared with FIG. 9B, a distance between a third line area LA3 and a third color light emitting area PXA-B and a distance between a fourth line area LA4 and the third color light emitting area PXA-B are changed. The third line area LA3 and the fourth line area LA4 may be spaced apart from the third color light emitting area PXA-B by the third distance C1. The third line area LA3 may be spaced apart from a third-second color light emitting area PXA-G30 by the second distance B1, and the fourth line area LA4 may be spaced apart from a fourth-second color light emitting area PXA-G40 by the second distance B1.

Because the third line area LA3 is located relatively farther from the third-second color light emitting area PXA-G30 compared with the sensing electrode SE of FIG. 9B, an amount of the second color light, i.e., the green light, traveling to a sixth measurement point P60 may increase. Because the fourth line area LA4 is located relatively farther from the fourth-second color light emitting area PXA-G40 compared with the sensing electrode SE of FIG. 9B, the amount of the second color light, i.e., the green light, traveling to a second measurement point P20 may increase.

When compared with the sensing electrode SE of FIG. 9B, the third line area LA3 and the fourth line area LA4 are located relatively closer to the third color light emitting area PXA-B, an amount of the third color light, i.e., the blue light, traveling to the second measurement point P20 and the sixth measurement point P60 may decrease.

Figure 10A:
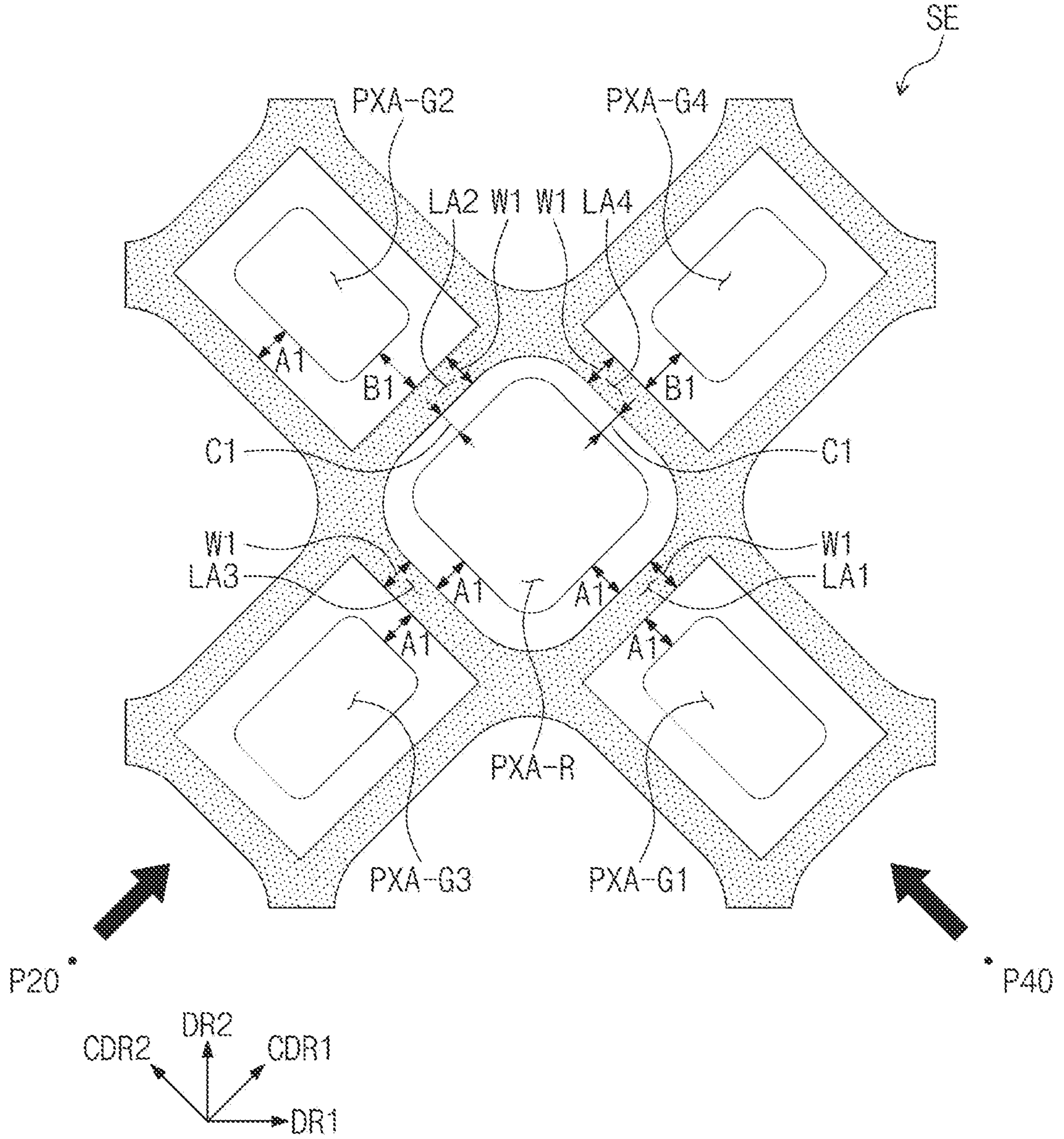
FIGS. 10A and 10B are plan views of an arrangement relationship between a light emitting area and a sensing electrode according to some embodiments of the present disclosure.
Figure 10B:
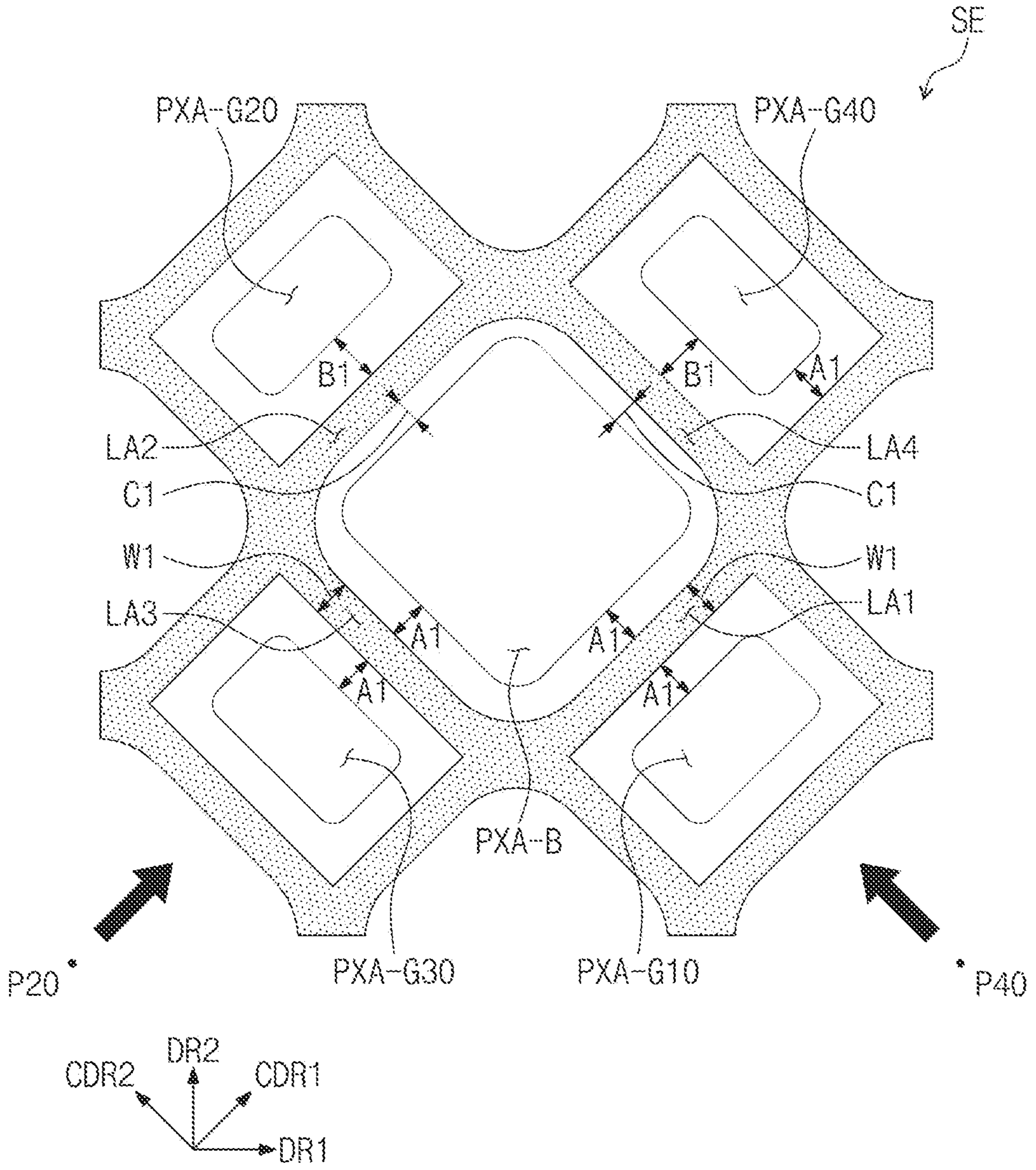

FIGS. 10A and 10B are plan views of an arrangement relationship between light emitting areas PXA-R, PXA-G, and PXA-B and a sensing electrode SE according to some embodiments of the present disclosure. In FIGS. 10A to 10B, detailed descriptions of the same elements as those of FIGS. 8A and 8B will be omitted.

According to some embodiments, the white angular dependency (WAD) may occur in the white image provided from the display panel 100. When the white image generated by the display panel 100 is measured, the change Δu' of the first color coordinate measured at the second measurement point P20 may have a relatively greater positive value. This is because a large amount of red light is provided or a small amount of green light is provided toward the second measurement point P20 due to the structure of the display panel 100.

According to some embodiments, the white angular dependency (WAD) caused by the display panel 100 may be compensated for by the sensing electrode SE. It is possible to provide a relatively larger amount of the green light toward the second measurement point P20 by changing the structure of the sensing electrode SE.

Referring to FIGS. 10A and 10B, a distance between a fourth-second color light emitting area PXA-G4 and a fourth line area LA4 may be different from a distance between a first color light emitting area PXA-R and the fourth line area LA4. The fourth line area LA4 may be spaced apart from the fourth-second color light emitting area PXA-G4 by the second distance B1, and the fourth line area LA4 may be spaced apart from the first color light emitting area PXA-R by the third distance C1. As the fourth line area LA4 is located relatively farther from the fourth-second color light emitting area PXA-G4, the fourth-second color light emitting area PXA-G4 may provide a larger amount of the second color light in a direction to the second measurement point P20. As the distance between the fourth line area LA4 and the fourth-second color light emitting area PXA-G4 increases, the amount of the second color light provided in the direction to the second measurement point P20 may increase. Referring to FIG. 10B, a distance between a fourth-second color light emitting area PXA-G40 and a fourth line area LA4 may be different from a distance between a third color light emitting area PXA-B and the fourth line area LA4. The fourth line area LA4 may be spaced apart from the fourth-second color light emitting area PXA-G40 by the second distance B1, and the fourth line area LA4 may be spaced apart from the first color light emitting area PXA-R by the third distance C1. As the fourth line area LA4 is located relatively farther from the fourth-second color light emitting area PXA-G40, the fourth-second color light emitting area PXA-G40 may provide a larger amount of a second color light in a direction to the second measurement point P20. As the distance between the fourth line area LA4 and the fourth-second color light emitting area PXA-G40 increases, the amount of the second color light provided in the direction to the second measurement point P20 may increase.

In FIG. 4, it may be observed that the change Δu' of the first color coordinate measured at the second measurement point P20 is relatively small. Different from FIG. 4, even though the change Δu' of the first color coordinate measured at the second measurement point P20 is relatively large, the sensing electrode SE may be designed as shown in FIGS. 10A and 10B. That is, the reason to design the sensing electrode SE as shown in FIGS. 10A and 10B should not be limited to the white angular dependency (WAD) caused by the display panel 100.

Figure 11A:
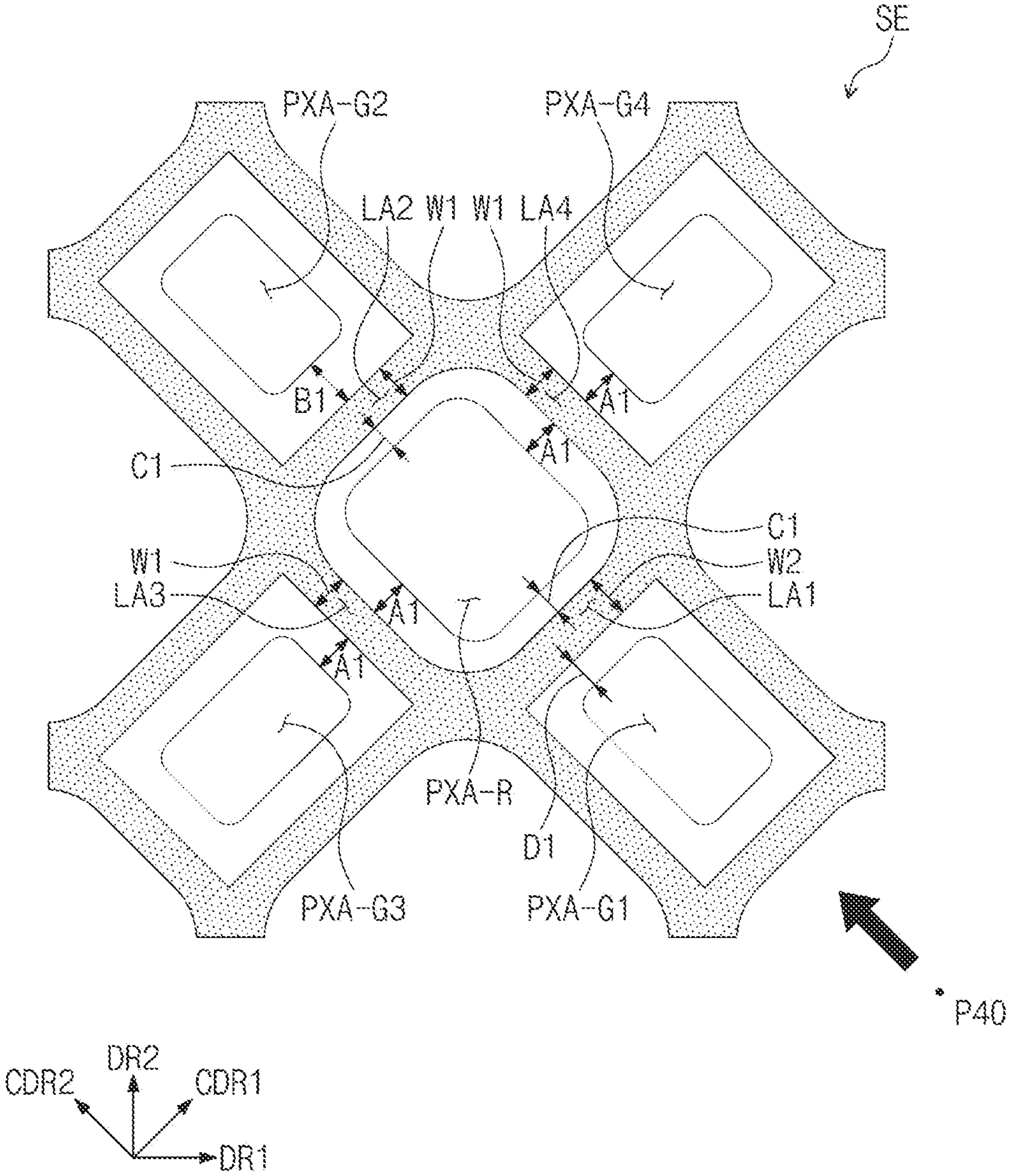
FIGS. 11A and 11B are plan views of an arrangement relationship between a light emitting area and a sensing electrode according to some embodiments of the present disclosure.
Figure 11B:
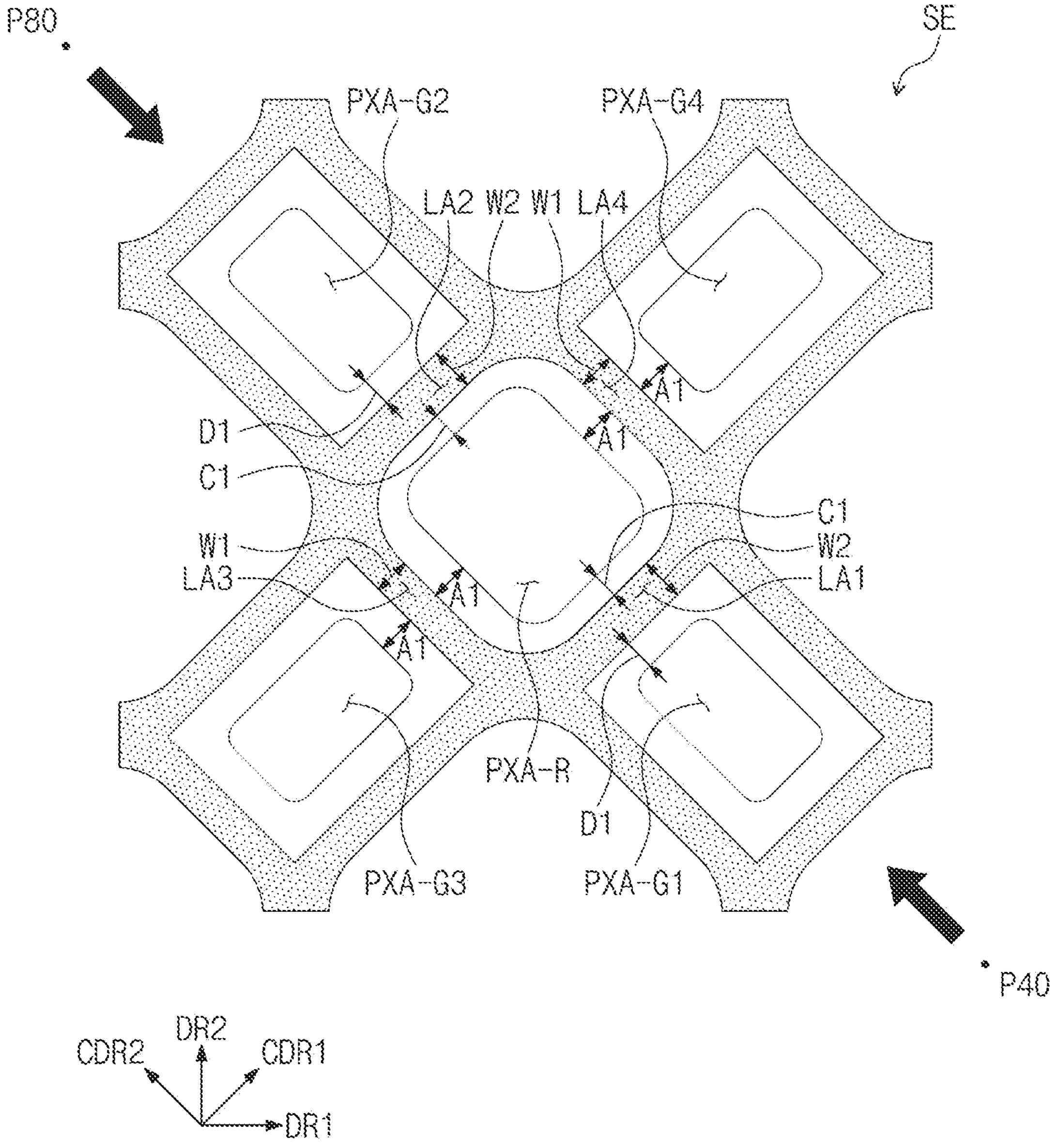

FIGS. 11A and 11B are plan views of an arrangement relationship between light emitting area PXA-R, PXA-G, and PXA-B and a sensing electrode SE according to some embodiments of the present disclosure. In FIGS. 11A and 11B, detailed descriptions of the same elements as those of FIG. 9A will be omitted.

According to some embodiments, the white angular dependency (WAD) caused by the polarizing film may be compensated for by controlling a line width of a first line area LA1 and a second line area LA2. As the line width of the first line area LA1 and the second line area LA2 increases, the light shielding efficiency described with reference to FIG. 7 may increase.

Referring to FIG. 11A, the first line area LA1 may have the line width greater than that of the second line area LA2, a third line area LA3, and a fourth line area LA4. According to some embodiments, the line width W1 of each of the second line area LA2, the third line area LA3, and the fourth line area LA4 may be about 3 micrometers, and the line width W2 of the first line area LA1 may be about 6 micrometers, however, they should not be limited thereto or thereby. According to some embodiments, it is sufficient that the line width W2 of the first line area LA1 is greater than about 3 micrometers.

As the line width of the first line area LA1 increases, a distance D1 between the first line area LA1 and a first-second color light emitting area PXA-G1 may be smaller than the second distance B1. The distance D1 between the first line area LA1 and the first-second color light emitting area PXA-G1 may be smaller than the second distance B1 by an increase of the line width W2 of the first line area LA1. The distance D1 between the first line area LA1 and the first-second color light emitting area PXA-G1 may be equal to or greater than the first distance A1 between the third line area LA3 and a third-second color light emitting area PXA-G3 and between the third line area LA3 and a first color light emitting area PXA-R and may be smaller than the second distance B1 between the second line area LA2 and a second-second color light emitting area PXA-G2.

The first line area LA1 in which the line width increases may more block the first color light traveling to the fourth measurement point P40 from the first color light emitting area PXA-R. The case that the first color light is blocked means that the change Δu' of the first color coordinate measured at the fourth measurement point P40 decreases.

According to the simulated result, the change Δu' of the first color coordinate of the white image passing through the display device DD (refer to FIG. 2), which includes the sensing electrode SE of FIG. 11A and the optical film of FIG. 4, was calculated as about 0.0006 at the fourth measurement point P40. According to the simulated result, the change Δu' of the first color coordinate of the raw white image passing through the sensing electrode SE of FIG. 11A was calculated as about −0.0058 at the fourth measurement point P40.

According to the simulated result, the change Δu' of the first color coordinate of the white image passing through the display device DD (refer to FIG. 2), which includes the sensing electrode SE of FIG. 11A and the optical film of FIG. 4, was calculated as about 0.0038 at the eighth measurement point P80. According to the simulated result, the change Δu' of the first color coordinate of the raw white image passing through the sensing electrode SE of FIG. 11A was calculated as about −0.0019 at the eighth measurement point P80. Because the shielding efficiency of the second line area LA2 with respect to the first color light is relatively low, the change Δu' of the first color coordinate may be small at the eighth measurement point P80 when compared to that at the fourth measurement point P40.

Referring to FIG. 11B, a first line area LA1 and a second line area LA2 may have a line width greater than that of a third line area LA3 and a fourth line area LA4. According to some embodiments, the line width W1 of the third line area LA3 and the fourth line area LA4 may be about 3 micrometers, and the line width W2 of the first line area LA1 and the second line area LA2 may be about 6 micrometers.

The first line area LA1 in which the line width increases may more shield the first color light traveling to the fourth measurement point P40 from a first color light emitting area PXA-R. The second line area LA2 in which the line width increases may more shield the first color light traveling to the eighth measurement point P80 from the first color light emitting area PXA-R.

According to the simulated result, the change Δu' of the first color coordinate of the white image passing through the display device DD (refer to FIG. 2), which includes the sensing electrode SE of FIG. 11B and the optical film of FIG. 4, was calculated as about 0.0014 at the fourth measurement point P40. According to the simulated result, the change Δu' of the first color coordinate of the raw white image passing through the sensing electrode SE of FIG. 11B was calculated as about −0.0050 at the fourth measurement point P40.

According to the simulated result, the change Δu' of the first color coordinate of the white image passing through the display device DD (refer to FIG. 2), which includes the sensing electrode SE of FIG. 11B and the optical film of FIG. 4, was calculated as about 0.0012 at the eighth measurement point P80. According to the simulated result, the change Δu' of the first color coordinate of the raw white image passing through the sensing electrode SE of FIG. 11B was calculated as about −0.0050 at the eighth measurement point P80. The change Δu' of the first color coordinate measured at the fourth measurement point P40 may be substantially the same as the change Δu' of the first color coordinate measured at the eighth measurement point P80.

According to some embodiments, the first line area LA1 and the second line area LA2 have the same line width W2, however, they should not be limited thereto or thereby. The line width W2 of the first line area LA1 and the second line area LA2 may be controlled by taking into account a relative magnitude of the change Δu' of the first color coordinate measured at the fourth measurement point P40 and the eighth measurement point P80. When the change Δu' of the first color coordinate measured at the fourth measurement point P40 is greater than the change Δu' of the first color coordinate measured at the eighth measurement point P80, the first line area LA1 may be designed to have the line width greater than that of the second line area LA2.

Figure 12:
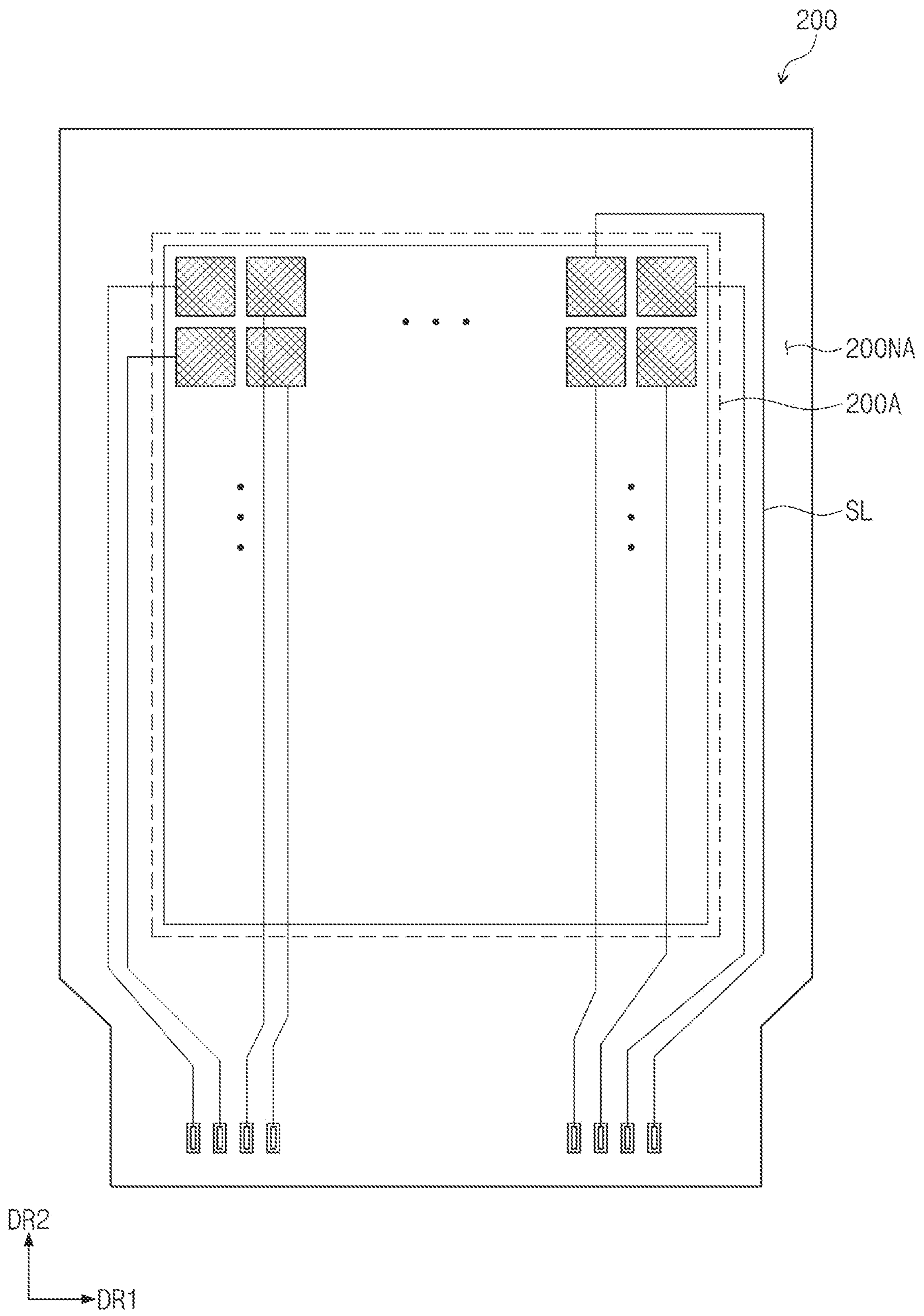
FIG. 12 is a plan view of an input sensor according to some embodiments of the present disclosure.

FIG. 12 shows an input sensor 200 that includes a conductive layer having a single-layer structure and driven in a self-capacitance method. The structure and the features of the sensing electrode described with reference to FIGS. 8A to 11B may be applied to the input sensor 200 described hereinafter, and the above-mentioned ward reduction effect may occur in the same way.

The input sensor 200 may include a plurality of sensing electrodes SE and a plurality of signal lines SL. The sensing electrodes SE may have unique coordinates information. For instance, the sensing electrodes SE may be arranged in a matrix form and may be connected to the signal lines SL, respectively.

Although aspects of some embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of embodiments according to the present inventive concept shall be determined according to the attached claims, and their equivalents.

What is claimed is:

1. A display device comprising:

a display panel comprising first color light emitting areas, second color light emitting areas, and third color light emitting areas and a non-light-emitting area between the first color light emitting areas, the second color light emitting areas, and the third color light emitting areas; and an input sensor comprising a sensing electrode comprising a conductive line overlapping the non-light-emitting area and providing a first opening corresponding to each of the first color light emitting areas, a second opening corresponding to each of the second color light emitting areas and a third opening corresponding to each of the third color light emitting areas, wherein an area of the first opening, an area of the second opening, and an area of the third opening are different each other, wherein a first-first color light emitting area among the first color light emitting areas is positioned between a first-second color light emitting area among the second color light emitting areas and a third-second color light emitting area among the second color light emitting areas in a first direction and a first-third color light emitting area among the third color light emitting areas is positioned between a second-second color light emitting area among the second color light emitting areas and a fourth-second color light emitting area among the second color light emitting areas in the first direction, the conductive line comprises a first line area between the first-first color light emitting area and the first-second color light emitting area, a second line area between the second-second color light emitting area and the first-third color light emitting area, a third line area between the first-first color light emitting area and the third-second color light emitting area, and a fourth line area between the first-third color light emitting area and the fourth-second color light emitting area, a distance between the third line area and the first-first color light emitting area is greater than a distance between the first line area and the first-first color light emitting area and a distance between the fourth line area and the first-third color light emitting area is greater than the distance between the second line area and the first-third color light emitting area, and a distance between the first line area and the first-second color light emitting area is greater than the distance between the first line area and the first-first color light emitting area and a distance between the second line area and the second-second color light emitting area is greater than a distance between the second line area and the first-third color light emitting area, within the first direction, the first-second color light emitting area and the second-second color light emitting area are arranged on a same side from the first-first color light emitting area and the first-third color light emitting area, respectively, the display panel further comprising a spherical coordinate system defined therein, wherein a white image displayed in the display panel is measured as a white image shifted to a source light of the second color light emitting areas from a first point (r1, Θ1, ϕ1) of the spherical coordinate system, the first point (r1, Θ1, ϕ1) is on an extension line of the first-first color light emitting area and the first-second color light emitting area in the first direction, and the first-first color light emitting area is closer to the first point (r1, Θ1, ϕ1) than the first-second color light emitting area.

2. The display device of claim 1, wherein each of the first line area and the second line area extends in a second direction crossing the first direction, and the first line area and the second line area have a same line width.

3. The display device of claim 1, wherein the distance between the third line area and the first-first color light emitting area is smaller than the distance between the first line area and the first-second color light emitting area.

4. The display device of claim 3, wherein each of the first line area and the third line area extends in a second direction crossing the first direction, and the first line area has a line width greater than a line width of the third line area.

5. The display device of claim 1, wherein a distance between the third line area and the third-second color light emitting area is greater than the distance between the third line area and the first-first color light emitting area.

6. The display device of claim 5, wherein the distance between the first line area and the first-second color light emitting area is equal to or greater than the distance between the third line area and the third-second color light emitting area.

7. The display device of claim 1, wherein the distance between the fourth line area and the first-third color light emitting area is smaller than a distance between the fourth line area and the fourth-second color light emitting area.

8. The display device of claim 7, wherein each of the second line area and the third line area extends in a second direction crossing the first direction, and a line width of the second line area is equal to a line width of the third line area.

9. The display device of claim 7, wherein the distance between the second line area and the first-third color light emitting area is equal to the distance between the fourth line area and the first-third color light emitting area.

10. The display device of claim 1, wherein a distance between the fourth line area and the fourth-second color light emitting area is greater than the distance between the fourth line area and the first-third color light emitting area, and the distance between the second line area and the second-second color light emitting area is equal to or greater than the distance between the fourth line area and fourth-second color light emitting area.

11. The display device of claim 1, wherein each of the first-first color light emitting area, the first-second color light emitting area, the second-second color light emitting area, and the first-third color light emitting area, comprises a first edge, a second edge facing the first edge in the first direction, a third edge, and a fourth edge facing the third edge in a second direction crossing the first direction.

12. The display device of claim 11, wherein the first-second color light emitting area extends in the first direction, and the second-second color light emitting area extends in the second direction.

13. The display device of claim 1, further comprising an optical film on the input sensor, wherein the optical film comprises a polarizing film and a retarder film.

14. The display device of claim 1, further comprising an optical film on the input sensor, wherein a white image passed through the optical film is shifted to a source light of the first color light emitting areas from the first point (r1, Θ1, ϕ1) when compared with a white image incident into the optical film.

15. The display device of claim 1, wherein each of the first line area and the second line area extends in a second direction crossing the first direction, the first color light emitting areas and the third color light emitting areas define a first light emitting row, the second color light emitting areas define a second light emitting row, and the first color light emitting areas are alternately arranged with the third color light emitting areas in the first light emitting row along a third direction crossing the first direction and the second direction.

16. A display device comprising:

a display panel comprising first color light emitting areas, second color light emitting areas, and third color light emitting areas and a non-light-emitting area between the first color light emitting areas, the second color light emitting areas, and the third color light emitting areas; and an input sensor comprising a sensing electrode comprising a conductive line overlapping the non-light-emitting area and on the display panel, wherein a first-first color light emitting area among the first color light emitting areas is positioned between a first-second color light emitting area among the second color light emitting areas and a third-second color light emitting area among the second color light emitting areas in a first direction, a first-third color light emitting area among the third color light emitting areas is positioned between a second-second color light emitting area among the second color light emitting areas and a fourth-second color light emitting area among the second color light emitting areas in the first direction, the conductive line comprises a first line area between the first-first color light emitting area and the first-second color light emitting area, a second line area between the second-second color light emitting area and the first-third color light emitting area, a third line area between the first-first color light emitting area and the third-second color light emitting area, and a fourth line area between the first-third color light emitting area and the fourth-second color light emitting area, and the first line area has a line width greater than a line width of each of the second line area and the third line area, and the second line area has a line width substantially the same as a line width of the fourth line area, within the first direction, the first-second color light emitting area and the second-second color light emitting area are arranged on a same side from the first-first color light emitting area and the first-third color light emitting area, respectively, the display panel further comprising a spherical coordinate system defined therein, wherein a white image displayed in the display panel is measured as a white image shifted to a source light of the second color light emitting areas from a first point (r1, Θ1, ϕ1) of the spherical coordinate system, the first point (r1, Θ1, ϕ1) is on an extension line of the first-first color light emitting area and the first-second color light emitting area in the first direction, and the first-first color light emitting area is closer to the first point (r1, Θ1, ϕ1) than the first-second color light emitting area.

17. The display device of claim 16, wherein the conductive line further comprises a fifth line area extending from the first line area in the first direction and adjacent to the first-first color light emitting area, and the line width of the first line area is greater than a line width of the fifth line area.

* * * * *